United States Patent
Heath, Jr. et al.

(10) Patent No.: US 8,638,874 B2
(45) Date of Patent: Jan. 28, 2014

(54) PROGRESSIVE FEEDBACK FOR HIGH RESOLUTION LIMITED FEEDBACK WIRELESS COMMUNICATION

(71) Applicant: FutureWei Technologies, Inc., Plano, TX (US)

(72) Inventors: Robert Wendell Heath, Jr., Austin, TX (US); Tao Wu, Carlsbad, CA (US)

(73) Assignee: FutureWei Technologies, Inc., Plano, TX (US)

( * ) Notice: Subject to any disclaimer, the term of this patent is extended or adjusted under 35 U.S.C. 154(b) by 0 days.

(21) Appl. No.: 13/670,325

(22) Filed: Nov. 6, 2012

(65) Prior Publication Data

US 2013/0064315 A1    Mar. 14, 2013

Related U.S. Application Data

(62) Division of application No. 12/434,529, filed on May 1, 2009, now Pat. No. 8,306,146.

(60) Provisional application No. 61/049,694, filed on May 1, 2008.

(51) Int. Cl.
*H04B 15/00* (2006.01)

(52) U.S. Cl.
USPC ........................................................ 375/285

(58) Field of Classification Search
USPC .......................................... 375/285, 260, 346
See application file for complete search history.

(56) References Cited

U.S. PATENT DOCUMENTS

| 7,738,925 B2 | 6/2010 | Nguyen et al. |
| 2006/0018389 A1* | 1/2006 | Koorapaty et al. ........... 375/259 |
| 2006/0092054 A1 | 5/2006 | Li et al. |
| 2007/0191066 A1 | 8/2007 | Khojastepour et al. |
| 2009/0047999 A1 | 2/2009 | Xia et al. |

FOREIGN PATENT DOCUMENTS

| CN | 101009098 A | 8/2007 |
| WO | WO 2006/049417 A1 | 5/2006 |
| WO | WO 2007/066936 A2 | 6/2007 |

OTHER PUBLICATIONS

"Extended European Search Report," Applicant No. 09737711.3-2411, Applicant: Huawei Technologies Co., Ltd., mailing date: Feb. 22, 2011, 8 pages.

(Continued)

*Primary Examiner* — Kevin Kim
(74) *Attorney, Agent, or Firm* — Slater & Matsil, L.L.P.

(57) ABSTRACT

A system and method is proposed for progressively quantizing channel state information for application in a MIMO (multiple input multiple output) communication system. A method includes computing an estimate of a communications channel between a subscriber unit and a base station, quantizing the estimate with a first codebook, thereby producing a first quantized estimate, quantizing an (n−1)-th quantized estimate with an n-th codebook, thereby producing an n-th quantized estimate, where n is an integer value ranging from 2 to R, R is a total number of quantizations of the estimate, wherein the n-th codebook is a localized codebook. The method also includes incrementing n, repeating the quantizing an (n−1)-th quantized estimate until n=R, and transmitting information based on the R quantized estimates to the base station.

21 Claims, 12 Drawing Sheets

(56) References Cited

OTHER PUBLICATIONS

"Written Opinion of the International Searching Authority," International Application No. PCT/CN2009/071628, Applicant: Huawei Technologies Co., LTD., et al., mailing date: Aug. 6, 2009, 3 pages.
R1-072235, Samsung, "Codebook Design for 4Tx SU MIMO,"3 GPP TSG RAN WG1, May 7-11, 2007, pp. 1-17, Kobe, Japan.
RI-072201, Texas Instruments, et al. "Way Forward on 4-Tx Antenna Codebook for SU-MIMO," 3GPP TSG RAN WGI 49, Mar. 26-30, 2007, pp. 1-3, Kobe, Japan.
Inoue, T., et al. "Kerdock Codes for Limited Feedback Precoded MIMO Systems," IEEE Transactions on Signal Processing, vol. 57, No. 9, Sep. 2009, pp. 3711-3716.
Raghavan, V., et al. "Systematic Codebook Designs for Quantized Beamforming in Correlated MIMO Channels," IEEE Journal on Selected Areas in Communications, vol. 25, No. 7, Sep. 2007, pp. 1298-1310.
Samanta, R., et al. "Codebook Adaptation for Quantized MIMO Beamforming Systems," IEEE, Oct. 2005, pp. 376-380.

\* cited by examiner

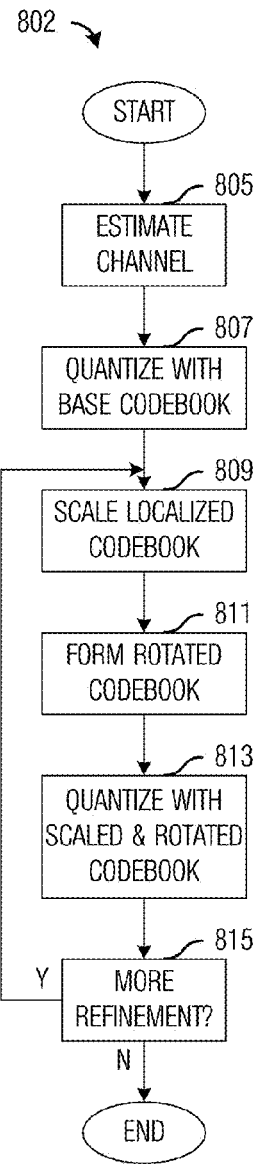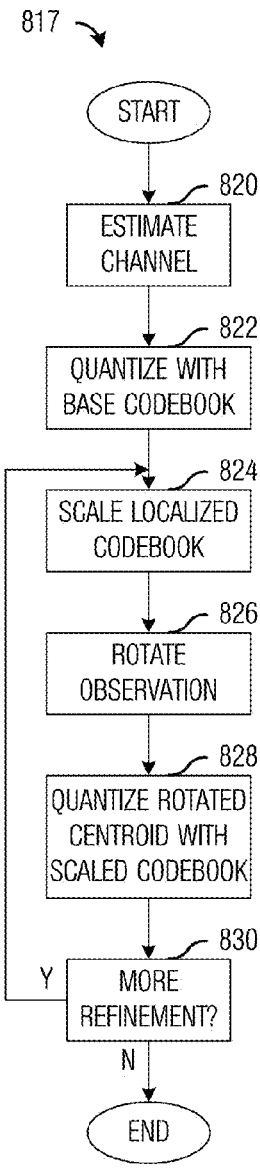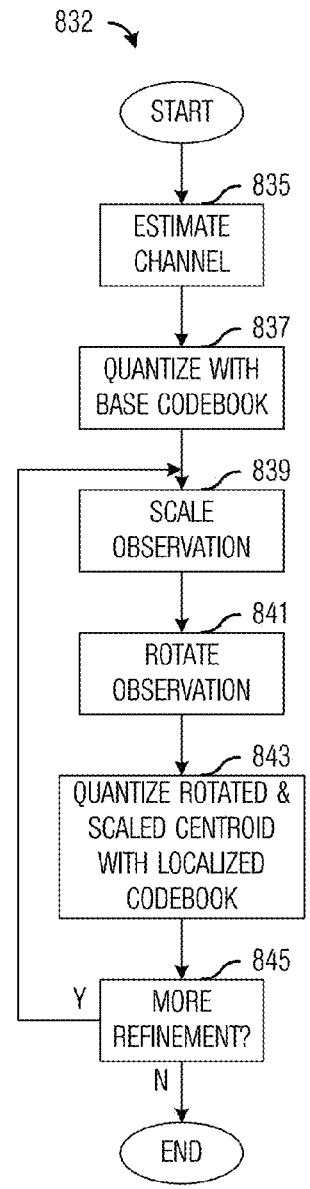
*Fig. 8a*  *Fig. 8b*  *Fig. 8c*

PROGRESSIVE FEEDBACK FOR HIGH RESOLUTION LIMITED FEEDBACK WIRELESS COMMUNICATION

This application is a divisional of U.S. patent application Ser. No. 12/434,529, filed May 1, 2009, entitled "Progressive Feedback For High Resolution Limited Feedback Wireless Communication," which claims priority to U.S. Provisional Application Ser. No. 61/049,694, filed on May 1, 2008, entitled "PROGRESSIVE FEEDBACK FOR HIGH RESOLUTION LIMITED FEEDBACK WIRELESS COMMUNICATION," which applications are hereby incorporated herein by reference

TECHNICAL FIELD

The present invention relates, in general, to wireless communications systems, and, in particular embodiments, to progressive feedback for high resolution limited feedback wireless communications.

BACKGROUND

Multiple-input multiple-output (MIMO) technology exploits the spatial components of the wireless channel to provide capacity gain and increased link robustness. After almost a decade of research, multiple-input multiple-output (MIMO) has finally been adopted in several standards including IEEE 802.16e—2005 and IEEE 802.11n; products based on draft standards are already shipping. MIMO is often combined with OFDM (orthogonal frequency division multiplexing), a type of digital modulation that makes it easy to equalize broadband channels.

In MIMO communication systems, at the transmitter, data are modulated, encoded, and mapped onto spatial signals, which are transmitted from the multiple transmit antennas. A main difference with non-MIMO communication systems is that there are many different spatial formatting modes for example beamforming, precoding, spatial multiplexing, space-time coding, and limited feedback precoding, among others (see A. Paulraj, R. Nabar, and D. Gore, Introduction to Space-Time Wireless Communications, 40 West 20th Street, New York, N.Y., USA: Cambridge University Press, 2003). The spatial formatting techniques have different performance (in terms of capacity, goodput, achievable rate, or bit error rate for example) in different channel environments. Consequently, there has been interest in adapting the spatial transmission mode based on information obtained about the channel.

One especially effective technique is known as closed-loop MIMO communication, where channel state information or other channel-dependent information is provided from the receiver to the transmitter through a feedback link. This information is used to customize the transmitted signal to the current propagation conditions to improve capacity, increase diversity, reduce the deleterious effects of fading, or support more users in the communication link for example. Because the bandwidth of the feedback link is low, techniques for quantizing channel state information and other receiver information have become increasingly important. This research area dealing with quantizing channel state information and other channel-dependent parameters is broadly known as limited feedback communication (see D. J. Love, R. W. Heath, Jr., W. Santipach, and M. L. Honig, "What is the Value of Limited Feedback for MIMO Channels?" IEEE Communications Magazine, vol. 42, no. 10, pp. 54-59, October 2003).

The concept of limited feedback can be applied to any communication system but it is especially valuable in MIMO communication systems.

Limited feedback precoding is a preferred embodiment of the limited feedback concept for MIMO communication channels. The main concept of limited feedback precoding is that an index of a quantized precoding matrix from a predetermined codebook of codewords in the form of precoding vectors or matrices (known at both the transmitter and receiver), is determined at the receiver and sent back to the transmitter over the feedback link. The determination of the preferred index can be made based on several different design criteria including maximum capacity, maximum goodput, minimum error rate, or minimum distortion for example. While the optimum index can be computed based on any number of measurements made at the receiver including the channel state estimates and statistics of the channel state like the mean and covariance, computations based directly on the channel state estimates are known to have the best performance.

The codebook employed in a limited feedback technique is known to have an impact on the eventual system performance. Larger codebooks, which require more bits to represent the index, are generally of higher resolution and have better performance at the expense of requiring more feedback to send back the codebook index. Smaller codebooks require fewer bits to represent the index of the chosen codeword, thus entailing reduced feedback overhead at the expense of lower resolution. Furthermore, larger codebooks require more storage space, which may tax the storage capabilities of the transmitter and the receiver. Because the feedback channel constitutes system overhead, there is a tension between using more feedback overhead to obtain higher resolution and using less feedback to reduce the penalty due to feedback overhead.

Many different codebook designs have been proposed in the literature for use in limited feedback precoding systems. A prominent example are Grassmannian codebooks (see D. Love and R. W. Heath Jr., "Limited feedback unitary precoding for orthogonal space-time block codes," IEEE Trans. Signal Processing, vol. 53, no. 1, pp. 64-73, 2005; D. Love, J. Heath, R. W., and T. Strohmer, "Grassmannian beamforming for multiple-input multiple-output wireless systems," IEEE Trans. Inform. Theory, vol. 49, no. 10, pp. 2735-2747, 2003; and D. Love and J. Heath, R. W., "Limited feedback unitary precoding for spatial multiplexing systems," IEEE Trans. Inform. Theory, vol. 51, no. 8, pp. 2967-2976, 2005). With Grassmannian codebooks, the codebook is designed to correspond to a good packing on the Grassmann manifold, essentially maximizing the minimum subspace distance measured using for example the Chordal distance, Fubini-Study distance, and projection 2-norm distance. These codebooks are optimal in some sense but only exist in special cases and are extremely difficult to compute even when they exist.

Vector quantization concepts have also been used to design codebooks (see A. Narula, M. J. Lopez, M. D. Trott, and G. W. Women, "Efficient use of side information in multiple-antenna data transmission over fading channels," IEEE J. Select. Areas Commun., vol. 16, no. 8, pp. 1423-1436, October 1998; and J. C. Roh and B. D. Rao, "Transmit beamforming in multiple-antenna systems with finite rate feedback: a VQ-based approach," IEEE Trans. Inform. Theory, vol. 52, no. 3, pp. 1101-1112, March 2006). The idea is that the codebook is constructed using an iterative technique according to a distortion measure like subspace distance, average capacity, or bit error rate for example. This approach can be used to design a codebook of any size but the codebook usually lacks structure to allow efficient storage. Further such codebooks may not be globally optimal since an iterative algorithm is employed.

Other codebooks have been proposed based on the Fourier transform (see for example D. Love and R. W. Heath Jr., "Limited feedback unitary precoding for orthogonal space-time block codes," IEEE Trans. Signal Processing, vol. 53, no. 1, pp. 64-73, 2005; and R1-072235, Samsung, "Codebook design for 4tx SU MIMO," 3GPP TSG RAN WG1 49, Kobe, Japan, 7-11 May, 2007. Available at http://www.3gpp.org/ftp/tsg ran/WG1 RL1/TSGR1 49/Docs/R1-072235.zip). These codebooks can be stored efficiently and have properties that may simplify computation. They only exist though for small codebook sizes.

Yet other codebooks have been designed based on Kerdock codes or mutually unbiased bases (T. Inoue and R. W. Heath Jr., "Kerdock codes for limited feedback MIMO systems," March 30-Apr. 4, 2008, Proc. of the IEEE Int. Conf. on Acoustics, Speech, and Signal Proc., Las Vegas, Nev.). This codebook is constructed from multiple sets of unitary matrices such that the maximum minimum inner product between columns is maximized. They have good properties that make them easy to search and a quarternary alphabet that makes them easy to store but the codebook size is limited.

Other codebooks have been suggested that have a nested structure allowing them to work with a different number of substreams including one, two, three, and four streams. An example of this is the Householder codebook design (R1-072201, "Way forward on 4-tx antenna codebook for su-mimo," 3GPP TSG RAN WG1 49, Kobe, Japan, 7-11 May, 2007. Available at http://www.3gpp.org/ftp/tsg ran/WG1 RL1/TSGR1 49/Docs/R1-072201.zip) where a beamforming codebook like a Grassmannian codebook is to compute Householder reflection matrices that are used to construct more complex codebooks using columns from these matrices. These codebooks have some advantages that they can be easy to store since the coefficients of the codewords can be represented with low precision, though the codebooks are somewhat small.

Other codebook designs have been suggested to exploit adaptive feedback to reduce the amount of feedback. One approach is to take advantage of spatial and temporal correlation to reduce the amount of feedback required. For example one approach is to use a set of possible codebooks. The best codebook changes over time and is adaptively sent back to the transmitter (see for example B. Mondal and R. W. Heath, Jr., "Channel Adaptive Quantization for Limited Feedback MIMO Beamforming systems," IEEE Trans. on Signal Processing, vol. 54, no. 12., pp. 4741-4740, December 2006). This approach requires additional overhead to signal the switch between codebooks in addition to the extra storage space to store the set of possible codebooks. In another approach to adaptive feedback (B. C. Banister and J. R. Zeidler, "Feedback Assisted Stochastic Gradient Adaptation of Multiantenna Transmission," IEEE Transactions on Wireless, vol. 4, no. 3, pp. 1121-1135, May 2005), gradients in an adaptive algorithm are quantized and sent back to the transmitter. This algorithm may take a long time to converge.

Another approach for codebooks that facilitate adaptation uses a localized codebook is combined with a non-local codebook to facilitate adaptation to spatial correlation (R. Samanta and R. W. Heath Jr., "Codebook Adaptation for Quantized MIMO Beamforming Systems," Proc. of the Asilomar Conference, October 2005, pp. pp. 376-380). This paper describes a localized codebook, scaling and rotation operations, and an adaptation mechanism. In this prior work localized codebooks are described but are used only when the source distribution is determined to be suitably localized. Thus there is an algorithm that effectively chooses the base codebook and the optimum radius for the localized codebook, then that codebook used during several quantization periods. Design criteria for finding the localized codebooks were not discussed. Their application to multiuser communication was not mentioned. Similarly, this concept was used in reference V. Raghavan, R. W. Heath, and A. M. Sayeed, "Systematic Codebook Designs for Quantized Beamforming in Correlated MIMO Channels," IEEE J. Select. Areas Commun., vol. 25, no. 7, pp. 1298-1310, September 2007. The key concept in this prior work is to show when correlated channels have sufficiently localized eigenvectors that can be reasonably quantized with a localized codebook. Design criteria for finding the localized codebooks were not discussed. Their application to multiuser communication was not mentioned.

Yet other codebooks are designed so that they can be searched efficiently (see for example D. J. Ryan, I. V. L. Clarkson, I. B. Collins, D. Guo, and M. L. Honig, "QAM Codebooks for Low-Complexity Limited Feedback MIMO Beamforming," Proc. of ICC 2007, pp. 4162-4167). In this case special mathematical structure in the codebook permits algorithms that can perform the quantization efficiently, at the expense of a larger codebook size for the same performance with other codebook techniques. The ability to search the codebook is especially important for high resolution limited feedback, which requires large codebook sizes, because without special structure a brute-force search of the codebook is required.

High resolution, or larger, codebooks are especially important for a type of MIMO communication known as multiuser MIMO or MU-MIMO (see D. Gesbert, M. Kountouris, R. W. Heath, Jr., C. B. Chae, and T. Salzer, "From Single user to Multiuser Communications: Shifting the MIMO paradigm," IEEE Signal Processing Magazine, Vol. 24, No. 5, pp. 36-46, October, 2007 and the references therein). In MU-MIMO, multiple users share the propagation channel. In what is known as the downlink or broadcast MU-MIMO channel, information is sent to multiple users via specially designed transmit beamformers or precoders determined based on channel state information. Users send information about their channel state through an uplink feedback channel.

The concept of limited feedback has been used in MU-MIMO communication systems (see for example N. Jindal, MIMO Broadcast Channels with Finite Rate Feedback, IEEE Trans. Information Theory, Vol. 52, No. 11, pp. 5045-5059, November 2006) to compress quantized information sent on the uplink. A main conclusion of this paper is that the codebook size in a MU-MIMO communication system measured in terms of number of bits grows in proportion to the number of users in the system. So if a single user MIMO system requires a 6 bit codebook, a MU-MIMO system supporting transmission to two users might require at least a 12 bit codebook (64 codewords versus 4,096 codewords). The codebook size also grows as a function of the operating SNR due to an error floor effect. Scheduling the best users can reduce this effect (see for example T. Yoo, N. Jindal, and A. Goldsmith, Multi-Antenna Downlink Channels with Limited Feedback and User Selection, IEEE Journal Sel. Areas in Communications, Vol. 25, No. 7, pp. 1478-1491, September 2007). Nonetheless, MU-MIMO requires high resolution limited feedback codebooks. Codebook designs have not been extensively investigated for MU-MIMO communication systems. The codebook designs discussed already are typically small, without the required resolution for MU-MIMO, or are large but require high complexity to search.

Practical codebook design require that several criteria are met, which is not solved. They should have low storage requirements. This means that high precision is not required to store each codebook entry. Unfortunately, much of the prior work (Grassmannian and vector quantization codebooks for example) does not satisfy this criterion.

Efficient algorithms with reasonable computational complexity should be available to efficiently search for an optimum codeword in the codebook. Unfortunately, most prior work (with the exception of the work by D. J. Ryan et. al.) gives codebooks that do not facilitate especially efficient codeword search. Most existing approaches for limited feedback codebook design are single shot in that they quantize the current channel state without considering the previous channel state. Adaptive codebook strategies, though, could be used to improve performance by only compressing changes in the channel state. Special codebooks are needed to allow efficient adaptive feedback but have only seen limited development (the work by Samanta et. al. for example).

Finally, it would be advantageous if codebooks could be applied to both single user and multiuser communication settings. Unfortunately, single user codebooks are usually designed to be smaller and are not big enough to support the resolution required by multiuser codebooks.

SUMMARY OF THE INVENTION

Select ones of the various embodiments of the present invention better quantize channel state information to achieve higher resolution quantization and, therefore, better performance of a wireless system. It provides a system and method for progressively quantizing channel state information using a non-localized base codebook and a localized codebook that shrinks with each successive refinement of the quantization step. Using preferred embodiments, the localized quantization can be performed with low storage and low complexity. Quantization with large codebooks can be performed by progressively applying the localized quantization algorithm, instead of performing a single shot quantization with a single very large codebook.

Representative embodiments of the present invention provide a system for progressive quantization in a wireless communication system with a plurality of base transceiver stations and a plurality of subscriber units. The system employs progressive channel state quantization at the subscriber and progressive channel reconstruction at the base transceiver station. Quantized channel state information may be used to compute the transmit beamforming vector for a single user or to compute the transmit beamforming vectors for serving multiple users simultaneously. A base codebook and a localized codebook faciliate the progressive quantization operation.

A method for progressive refinement channel state quantization is described that comprises quantization using a base codebook, successive quantization refinement steps using a localized codebook with the effective radius of the localized quantization operation getting smaller with each codebook step. In a preferred embodiment the successive quantization refinement steps scale the localized codebook, rotate the scaled localized codebook, and quantize with the rotated and scaled codebook. In another preferred embodiment the successive quantization refinement steps scale the localized codebook, rotate the channel observation, and quantize with the rotated channel observation with the scaled codebook. In another preferred embodiment the successive quantization refinement steps scales the observed channel observation, rotates the scaled channel observation, then quantizes the rotated and scaled channel observation with the localized codebook.

A method for progressive reconstruction of a progressively quantized channel state is described that comprises extracting the base and refinement codebook indices from a feedback message, scaling the entry of a localized codebook, rotating the scaled entry, and repeating the process.

In accordance with an embodiment, a method for subscriber unit operation in a wireless communications system is provided. The wireless communications system having a base station. The method includes computing an estimate of a communications channel between the subscriber unit and the base station, quantizing the estimate with a first codebook, thereby producing a first quantized estimate, quantizing an (n−1)-th quantized estimate with an n-th codebook, thereby producing an n-th quantized estimate, incrementing n, repeating the quantizing an (n−1)-th quantized estimate until n>R, and transmitting information based on the R quantized estimates to the base station. Where n is an integer value ranging from 2 to R and n initially being equal to 2, R is a total number of quantizations of the estimate. The n-th codebook is a localized codebook, In accordance with another embodiment, a method for base station operation in a wireless communications system is provided. The method includes receiving channel information from a subscriber unit, extracting R codebook indices from the channel information, progressively reconstructing a channel estimate using the R codebook indices, and outputting the reconstructed channel estimate. Where R is an integer number. The reconstructing starts at a first codebook index and continues to the R-th codebook index and the reconstructing a channel estimate using an n-th index makes use of an n-th codebook.

In accordance with another embodiment, a base station is provided. The base station includes a scheduler, a beamforming unit coupled to the scheduler, a progressive reconstruction unit, a single user unit coupled to the scheduler, to the beamforming unit, and to the progressive reconstruction unit, and a multi-user unit coupled to the scheduler, to the beamforming unit, and to the progressive reconstruction unit. The scheduler selects one or more users for transmission in a transmission opportunity, the beamforming unit maps information for the selected users onto a beamforming vector for transmission, and the progressive reconstruction unit reconstructs a channel estimate from channel feedback information provided by a subscriber station. The progressive reconstruction unit progressively creates the channel estimate from a base index to a base codebook and at least one refinement index to a localized codebook. The base index and the refinement indices are conveyed in the channel feedback information. The single user unit provides single user beamforming vectors to the beamforming unit. The single user beamforming vectors are generated by the single user unit based on the selected users and the channel estimate, and the multi-user unit provides multi-user beamforming vectors to the beamforming unit. The multi-user beamforming vectors are generated by the multi-user unit based on the selected users and the channel estimate.

In accordance with another embodiment, a subscriber station is provided. The subscriber station includes a channel estimate unit coupled to a receive antenna, a mobility estimate unit coupled to the receive antenna, a progressive quantization unit coupled to the channel estimate unit and to the mobility estimate unit, and a progressive feedback unit coupled to the progressive quantization unit. The channel estimate unit estimates characteristics of a communications channel between the subscriber station and a base station, and the mobility estimate unit computes a measure of the mobility of the subscriber station. The progressive quantization unit progressively quantizes the estimated characteristics of the communications channel by quantizing the estimated characteristics with a base codebook, thereby producing a quantized estimated characteristics, and progressively quantizing the quantized estimated characteristics with localized codebooks. The progressive feedback unit generates a feedback message from indices of a result of each of the quantizations into their respective codebooks.

An advantage of an embodiment is that a multiple codebooks are used to provide a coarse quantization of the channel state followed by refinements of the quantization of the channel state. The use of multiple codebooks may significantly reduce codebook size as well as the amount of feedback information.

Another advantage of an embodiment is that the number of refinements of the quantization may be adaptive. The number of refinements may be based on factors such as mobile device mobility, desired performance, user type, and so forth.

Yet another advantage of an embodiment is that incremental feedback may be used. In incremental feedback only an index of a refinement of an earlier quantization is fedback instead of indices of an entire quantization.

A further advantage of an embodiment is that the progressive refinement is applicable to both single user and multiuser situations.

The foregoing has outlined rather broadly the features and technical advantages of the present invention in order that the detailed description of the embodiments that follow may be better understood. Additional features and advantages of the embodiments will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 8a is a flow chart of subscriber unit operations in the progressive refinement of the quantization of channel state;

FIG. 8b is a flow chart of subscriber unit operations in the progressive refinement of the quantization of channel state;

FIG. 8c is a flow chart of subscriber unit operations in the progressive refinement of the quantization of channel state;

DETAILED DESCRIPTION OF ILLUSTRATIVE EMBODIMENTS

Embodiments of the present invention provides a novel method to improve performance of codebook-based wireless communication systems, which results in higher capacity and better quality links and thus improves the performance of a wireless system. It is understood, however, that the following disclosure provides many different embodiments, or examples, for implementing different features of the invention. Specific examples of components, signals, messages, protocols, and arrangements are described below to simplify the present disclosure. These are, of course, merely examples and are not intended to limit the invention from that described in the claims. Well known elements are presented without detailed description in order not to obscure the present invention in unnecessary detail. For the most part, details unnecessary to obtain a complete understanding of the present invention have been omitted inasmuch as such details are within the skills of persons of ordinary skill in the relevant art. Details regarding control circuitry described herein are omitted, as such control circuits are within the skills of persons of ordinary skill in the relevant art.

Figure 1:
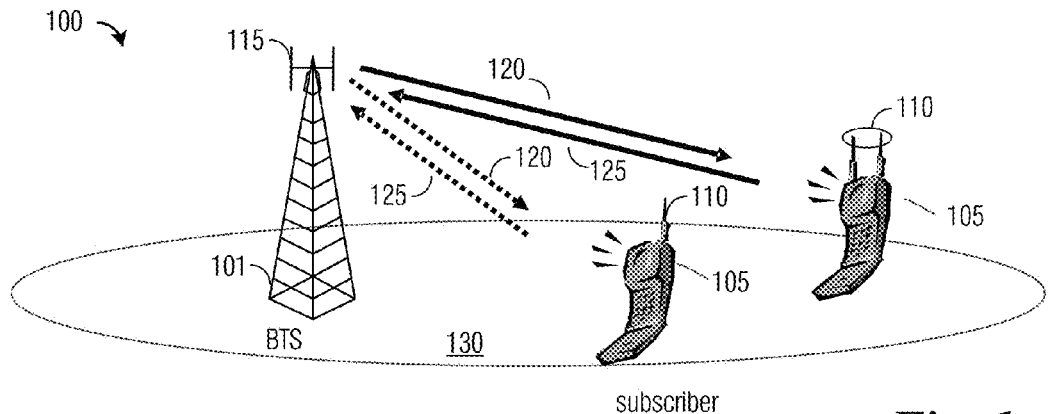
FIG. 1 is a diagram of a wireless communication system.

FIG. 1 illustrates a cellular communication system 100. Cellular communications system 100 includes a base transceiver station (BTS) 101 communicates and a plurality of subscriber units 105, which may be mobile or fixed. BTS 101 and subscriber units 105 communicate using wireless communication. BTS 101 has a plurality of transmit antennas 115 while subscriber units 105 have one or more receive antennas 110. BTS 101 sends control and data to subscriber units 105 through a downlink (DL) channel 120 while subscriber units 105 send control and data to BTS 101 through uplink (UL) channel 125.

Subscriber units 105 may send control information on uplink channel 125 to improve the quality of the transmission on downlink channel 120. BTS 101 may send control information on downlink channel 120 for the purpose of improving the quality of uplink channel 125. A cell 130 is a conventional term for the coverage area of BTS 101. It is generally understood that in cellular communication system 100 there may be multiple cells corresponding to multiple BTSs.

Figure 2A:
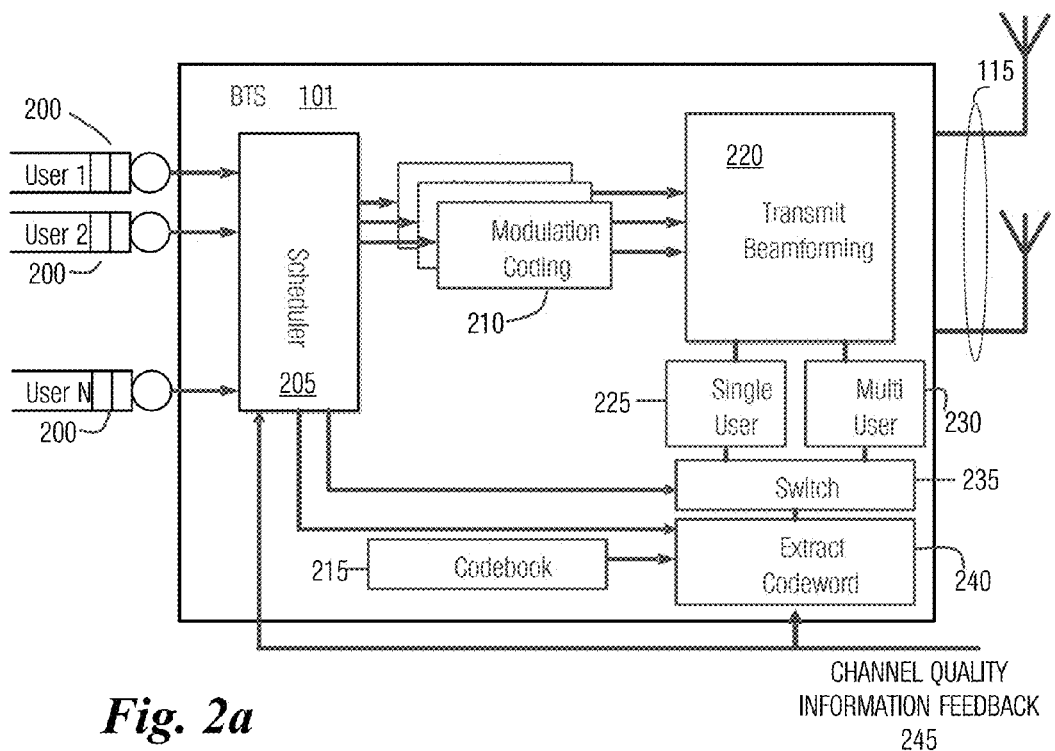
FIG. 2a is a diagram of a prior art base transceiver station (BTS)

FIG. 2a illustrates a prior art BTS 101. Data 200 destined for a plurality of users being served, in the form of bits, symbols, or packets for example, may be sent to a scheduler 205, which may decide which users will transmit in a given time/frequency opportunity. Scheduler 205 may use any of a wide range of known scheduling disciplines in the literature including round robin, maximum sum rate, proportional fair, minimum remaining processing time, or maximum weighted sum rate. Generally scheduling decisions are based on channel quality information feedback 245 feedback from a plurality of subscriber units.

Data from users selected for transmission are processed by modulation and coding block 210 to convert the data to transmitted symbols. Modulation and coding block 210 may also add redundancy for the purpose of assisting with error correction and/or error detection. A modulation and coding scheme implemented in modulation and coding block is chosen based in part on information about the channel quality information feedback 245.

The output of modulation and coding block 205 may be passed to a transmit beamforming block 220, which maps the output (a modulated and coded stream for each user) onto a beamforming vector. The beamformed outputs are coupled to antennas 115 through RF circuitry, which are not shown. The transmit beamforming vectors are input from a single user block 225 or a multi-user block 230.

Either beamforming for a single user or multiple user beamforming may be employed, as determined by switch 235, based on information from scheduler 205 as well as channel quality information feedback 245. Part of each user's channel quality information feedback includes an index to a codeword in codebook 215, corresponding to quantized channel information. The modulation/coding and beamforming may be repeated for all scheduled users based on the output from 205.

An extract codeword block 240 produces the quantized channel state information based on the index received from the channel quality information feedback 245. Extract codeword block 240 may use the index to reference the codeword from codebook 215. The output of extract codeword block 240 is passed to switch 235 that forwards the information to either single user block 225 or multi-user block 230. Other information may also be passed to these blocks, for example a signal-to-interference-plus-noise ratio (SINR) estimate may be passed to the multi-user block 230 to improve its performance. Single user block 225 uses the output of extract codeword block 240 as the beamforming vector for the selected user. Other processing may also be applied, such as interpolation in the case that orthogonal frequency division multiplexing (OFDM) modulation is employed.

Multi-user block 230 combines the codeword from codebook 215 and other information from multiple users to derive the transmit beamforming vectors employed for each user. It may use any number of algorithms widely known in the literature including zero forcing, coordinated beamforming, minimum mean squared error beamforming, or lattice reduction aided precoding for example. Channel quality information feedback 245 may, for purposes of illustration, be in the form of quantized channel measurements, modulation, coding, and/or spatial formatting decisions, received signal strength, and signal-to-interference-plus-noise measurements, and so forth.

Figure 2B:
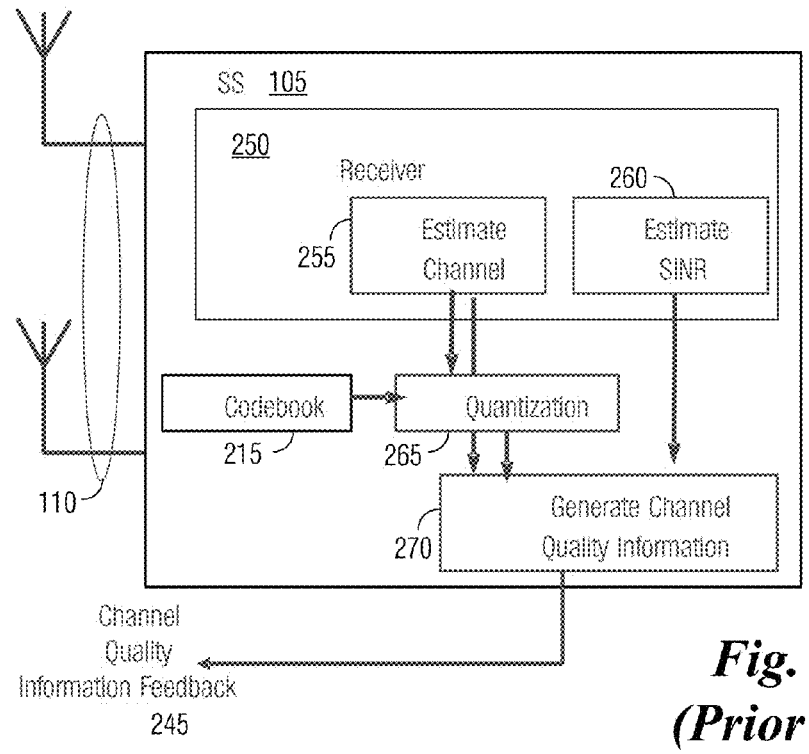
FIG. 2b is a diagram of a prior art subscriber unit.

FIG. 2b illustrates a prior art subscriber unit 105. Subscriber unit 105 may have one or a plurality of receive antennas 110, connecting through RF circuitry, not shown, to a receiver signal processing block 250. Some of the key functions performed by receiver signal processing block 250 may be channel estimation 255 and estimate signal-to-interference-plus-noise ratio (SINR) block 260. Channel estimation block 255 uses information inserted into the transmit signal in the form of training signals, training pilots, or structure in the transmitted signal such as cyclostationarity to estimate coefficients of the channel between BTS 101 and subscriber unit 105.

Channel state information is quantized in a codebook-based quantization block 265, which uses codebook 215 (the same codebook as codebook 215 of FIG. 2a) also available at BTS 101. The output of quantization block 265 may be the index of a codeword in codebook 215 that best corresponds to the channel state information. For example, the vector in codebook 215 that is closest to the estimated channel vector in terms of minimum subspace distance may be chosen, or the vector from codebook 215 that maximizes the effective SINR may be selected. The index of the codeword is provided to generate channel quality information block 270, which generates channel quality information feedback 245 from the index. The channel quality information feedback 245 may be used to aid scheduling and transmit beamforming, for example.

To better explain the prior art and the merits of the various embodiments, consider the following mathematical description. Consider first the single user transmission mode. Assuming a narrowband transmission (it is obvious how to extend the present results to broadband transmission using OFDM), the signal received at user u in discrete-time, after matched filtering and sampling, for single user transmission may be written as $$y_u = H_u f_u^{\#} s_u + v_u$$

where $y_u$ is the $M_r \times 1$ received signal vector (where $M_r$ is the number of receive antennas), $H_u$ is the $M_r \times M_t$ channel matrix (where $M_t$ is the number of transmit antennas at BTS 101) between BTS 101 and user u, $f_u^{\#}$ is the $M_t \times 1$ transmit beamforming vector designed for user u, $s_u$ is the symbol sent to user u, and $v_u$ is the additive noise vector at subscriber u's receiver of dimension $M_r \times 1$.

In prior art, the beamforming vector $f_u^{\#}$ chosen at the transmitter comes from a finite set of possible beamforming vectors $F = \{f_1, f_2, \ldots, f_N\}$, the coefficients of which may be from any number of codebooks known in the literature including Grassmannian codebooks, DFT codebooks, vector quantization codebooks, etc.

The size of the codebook is given by N and is sometimes given in bits $\log_2 N$. Prior art considers codebooks of size around 6 bits. The receiver selects the index of the best vector from the codebook at the receiver according to any number of codeword selection criteria. For example, quantization block 265 may compute the optimum index as $$k_u = \max_{n=1,2,\ldots,N} \|H_u f_n\|$$

and this index is incorporated into channel quality information feedback 245 by generate channel quality information message block 270. In another embodiment, quantization block 265 computes the dominant right singular vector of $H_u$ as v then computes the optimum index as $$k_u = \min_{n=1,2,\ldots,N} d(v, f_n)$$

using a subspace distance like the chordal distance. BTS 101 then extracts codeword block sets $f_u^{\#} = f_{k^*}$, basically the index received on the feedback channel is used to generate the beamforming vector used for transmission.

Now consider one embodiment of the multiple user transmission mode. For illustrative purposes suppose that $M_t = 2$, $M_r=1$, and there are two users a and b chosen by the scheduler. Suppose the transmit beamforming vectors are computed using the zero-forcing precoding methodology (described in T. Yoo, N. Jindal, and A. Goldsmith, Multi-Antenna Downlink Channels with Limited Feedback and User Selection, IEEE Journal Sel. Areas in Communications, Vol. 25, No. 7, pp. 1478-1491, September 2007 for example). The received signal at user a after matched filtering and sampling may be written as $$y_a = H_a f_a^\# s_a + H_a f_b^\# s_b + v_a$$

where $y_a$ is the $M_r \times 1$ received signal vector (where $M_r$ is the number of receive antennas), $H_a$ is the $M_r \times M_t$ channel matrix (where $M_t$ is the number of transmit antennas at the BTS) between BTS 101 and user a, $f_a^\#$ is the $M_t \times 1$ transmit beamforming vector designed for user a, $f_b^\#$ is the $M_t \times 1$ transmit beamforming vector designed for user b, $s_a$ is the symbol sent to user a, $s_b$ is the symbol sent to user b, and $v_a$ is the additive noise vector at subscriber a's receiver of dimension $M_r \times 1$.

A similar equation may be written for user b and this equation may naturally be generalized to more than two users. In the case of $M_r=1$ the user, may employ the same quantization method as described in the previous case to find an index for the quantized channel state in quantization block 265. Unlike the single user case, however, the user may also send additional information like an estimate of the signal-to-interference-plus-noise (SINR) ratio that includes effects of quantization. The reason is that because quantized channel state information is used, and there is residual interference that should be accounted for. This may be estimated in generate channel quality information block 270 using any number of techniques known in the literature.

BTS 101 uses the SINR information in scheduler 205 to select the users for transmission and also to estimate their transmission rates for modulation and coding block 210. With zero forcing precoding, multi-user block 230 may compute the transmit beamforming vector by inverting the matrix $[f_a, f_b]$, and normalizing the columns to produce the beamforming vectors $[f_a^\#, f_b^\#]$. Because of the effects of residual interference, multiuser systems as is well known in the prior art (see for example Yoo. Et. al.) require large codebook sizes, i.e., N may be large (for example, on the order of 4,096 or more). A major challenge is that it is very difficult to perform the quantization in quanitization block 265 and generate the reconstruction in extract codeword block 240 when the codebook size is large. The problem is overcome in the embodiments.

Figure 3A:
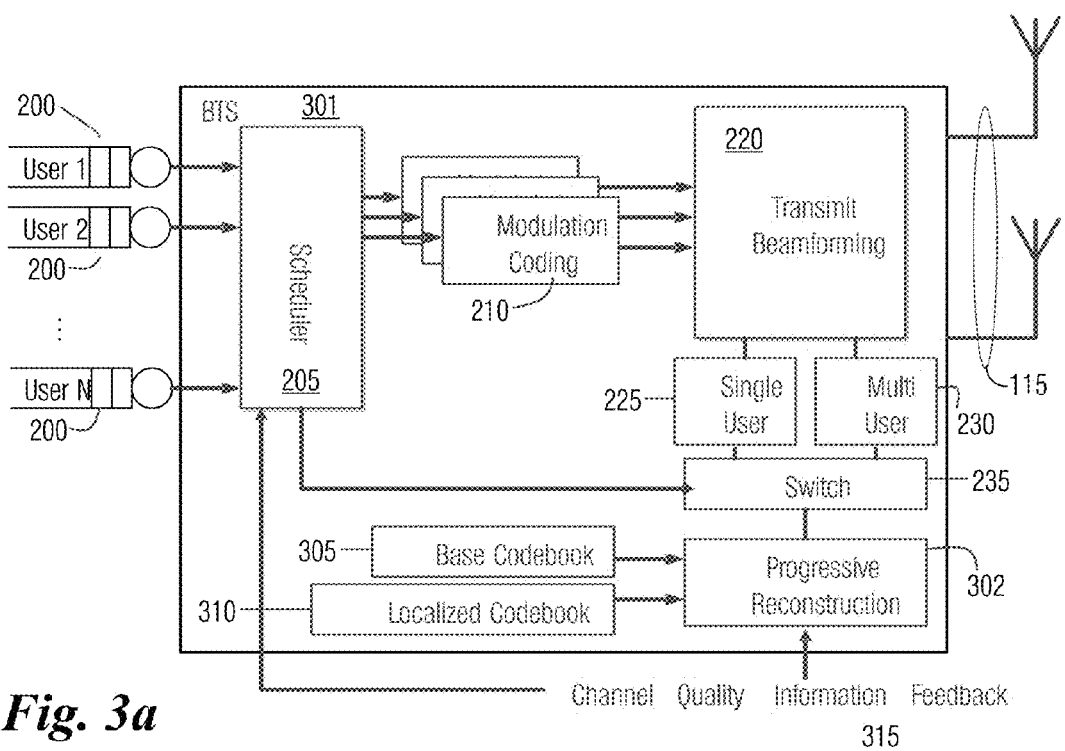
FIG. 3a is a diagram of a BTS.

FIG. 3a illustrates a BTS 301. Data 200 destined for a plurality of users being served, in the form of bits, symbols, or packets for example, are sent to a scheduler 205, which decides which users will transmit in a given time/frequency opportunity. Data from users selected for transmission are processed by modulation and coding block 210 to convert to transmitted symbols and add redundancy for the purpose of assisting with error correction or error detection. The modulation and coding scheme is chosen based in part on information about the channel quality information feedback 315.

The output of modulation and coding block 205 is passed to a transmit beamforming block 220, which maps the modulated and coded stream for each user onto a beamforming vector. The beamformed outputs are coupled to antennas 115 through RF circuitry. The transmit beamforming vectors are input from single user block 225 or multi-user block 230. Either beamforming for a single user or multi-user beamforming may be employed, as determined by switch 235, based on information from scheduler 205 and channel quality information feedback 315. Part of each users channel quality information feedback includes a new progressive feedback message that provides indices corresponding to progressively quantized channel information as described in the embodiments.

Progressive reconstruction block 302 uses the indices in the channel quality information feedback 315 combined with a base codebook 305 and a localized codebook 310 to reconstruct a high-resolution estimate of the quantized channel state information. The output of progressive reconstruction block 302 is passed to switch 235 that forwards the information to either the single user block 225 or the multi-user block 230. Other information may also be passed to these blocks, for example a SINR estimate may be passed to the multi-user block 230 to improve its performance. Single user block 225 uses the output of progressive reconstruction block 302 as the beamforming vector for the selected user.

Multi-user block 230 combines the codeword and other information from multiple users to derive the transmit beamforming vectors employed for each user. It may use any number of algorithms known in the literature including zero forcing, coordinated beamforming, minimum mean squared error beamforming, or lattice reduction aided precoding, for example.

Scheduler 205 may use any of the known scheduling disciplines in the literature including round robin, maximum sum rate, proportional fair, minimum remaining processing time, or maximum weighted sum rate; generally scheduling decisions are based on channel quality information feedback 315 received from the plurality of subscribers. Scheduler 205 may decide to send information to a single user via transmit beamforming or may decide to serve multiple users simultaneously through multiuser MIMO communication.

Modulation and coding block 210 may perform any number of coding and modulation techniques including quadrature amplitude modulation, phase shift keying, frequency shift keying, differential phase moduation, convolutional coding, turbo coding, bit interleaved convolutional coding, low density parity check coding, fountain coding; or block coding. The choice of modulation and coding rate in a preferred embodiment is made based on channel quality information feedback 315 in a preferred embodiment and may be determined jointly in the scheduler 205.

While not explicitly illustrated, it is obvious to those skilled in the art that OFDM modulation can be used. Further, any number of multiple access techniques could be used including orthogonal frequency division multiple access; code division multiple access; frequency division multiple access; or time division multiple access. The multiple access technique may be combined with the modulation and coding block 205 or the transmit beamforming block 220 among others.

Channel quality information feedback 315 may, for purposes of illustration, be in the form of quantized channel measurements, modulation, coding, and/or spatial formatting decisions, received signal strength, and signal-to-interference-plus-noise measurements.

Figure 3B:
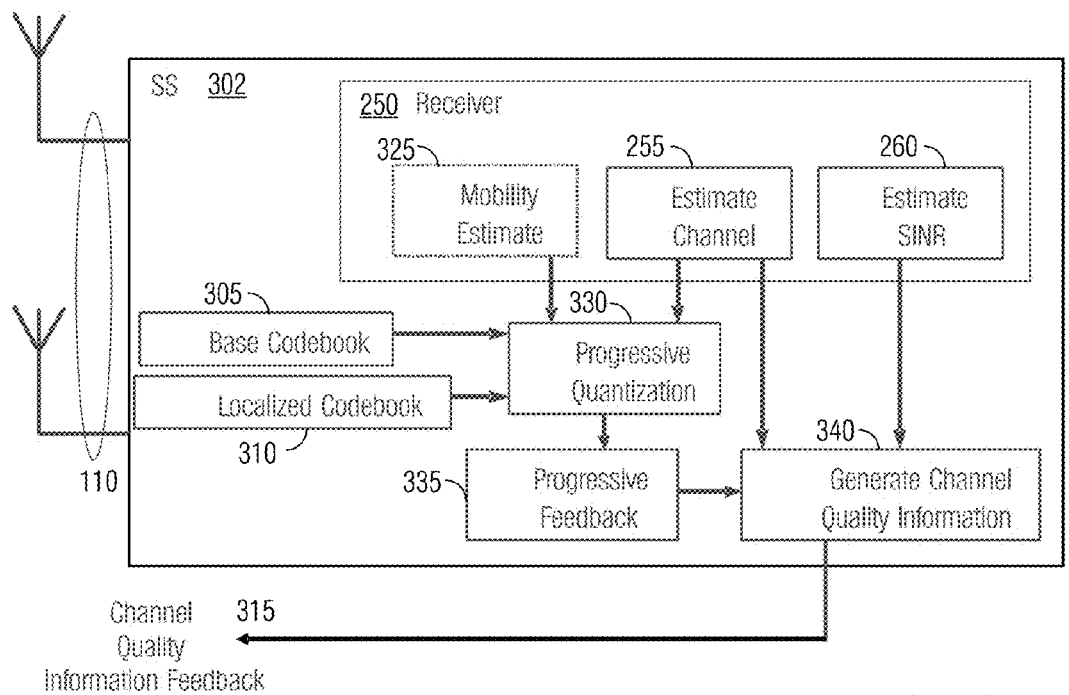
FIG. 3b is a diagram of a subscriber unit.

FIG. 3b illustrates subscriber unit 302. Subscriber unit 302 may have one or more receive antennas 110, connecting through RF circuitry to a receiver signal processing block 250. Some of the key functions performed by receiver signal processing block 250 include channel estimation block 255, estimate SINR block 260, and a mobility estimate block 325.

Channel state information is quantized using a progressive quantization block 330 as described in the embodiments. Progressive quantization block 330 first quantizes the received signal to a base codebook 305 then generates at least one successive refinement using a localized codebook 310.

With each progressive refinement, localized codebook 310 becomes more localized resulting in a more efficient quantization. An index from the base codebook and several indices from the localized codebook are output form progressive quantization block 330. An estimate of the amount of channel variation, produced by mobility estimate block 325, may be used to improve the progressive quantization algorithm by initializing the algorithm from a previous quantization level or adjusting the amount of localization.

Progressive feedback block 335 generates a new feedback message by combining the base and localized codebook indices output from progressive quantization block 330. Generate channel quality information block 340 generates a special feedback control message employing the outputs of progressive feedback block 335 to produce channel quality information feedback 315.

Channel estimation block 255 may employ any number algorithms known in the art including least squares, maximum likelihood, maximum a postiori, Bayes estimator, adaptive estimator, or a blind estimator. Some algorithms exploit known information inserted into the transmit signal in the form of training signals, training pilots, while others use structure in the transmitted signal such as cyclostationarity to estimate coefficients of the channel between the BTS and the subscriber.

Estimate SINR block 260 outputs some measure of performance corresponding to the desired signal. In one embodiment this consists of a received signal power to interference plus noise estimate. In another embodiment, it provides an estimate of the received signal-to-noise ratio. In yet another embodiment, it provides an estimate of the average received signal power, averaged over subcarriers in an OFDM system.

Figure 4A:
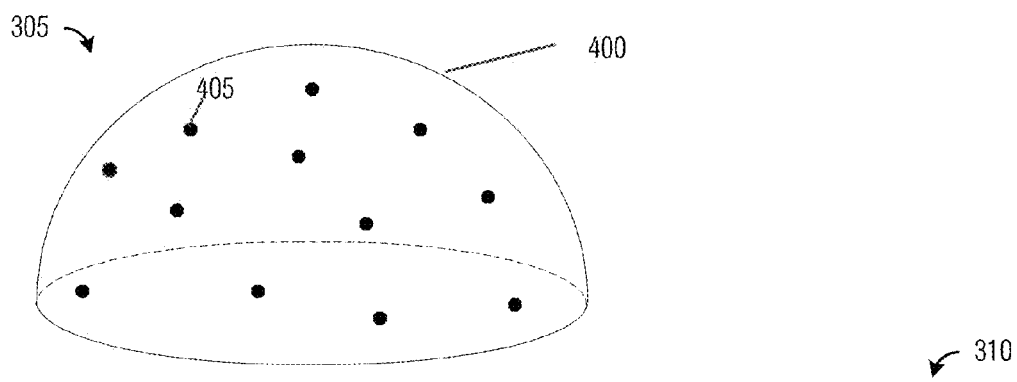
FIG. 4a is a diagram of a base codebook.
Figure 4B:
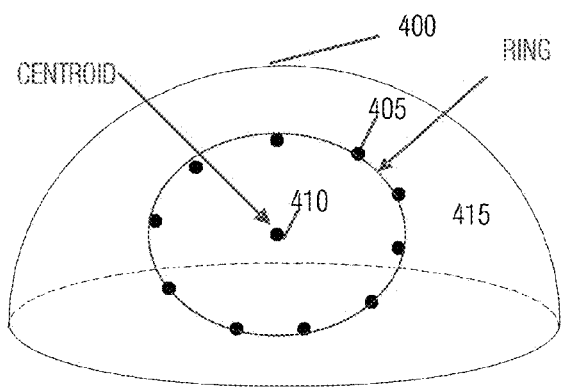
FIG. 4b is a diagram of a localized codebook.

The embodiments employ a new progressive quantization algorithm to enable efficient high resolution quantization. It employs two codebooks: a base codebook 305 and a localized codebook 310. FIG. 4a illustrates a representative example of base codebook 305 and FIG. 4b illustrates a representative example of localized codebook 310. The codebooks are illustrated in as points, such as points 405, on a unit sphere 400.

Base codebook 305 is used in the first step in the quantization process. As such, it should be as uniform as possible. Any design known to those skilled in the art could be use including Grassmannian codebooks, Kerdock codebooks, mutually unbiased bases, vector quantization derived codebooks, etc. Different codebooks may be employed for different numbers of antennas. The size the codebook can also be varied. A preferred embodiment for base codebook 305 for two transmit antennas is $$F_{3GPP,2} = \left\{ \begin{bmatrix} 1 \\ 0 \end{bmatrix}, \begin{bmatrix} 0 \\ 1 \end{bmatrix}, \frac{1}{\sqrt{2}}\begin{bmatrix} 1 \\ 1 \end{bmatrix}, \frac{1}{\sqrt{2}}\begin{bmatrix} 1 \\ -1 \end{bmatrix}, \frac{1}{\sqrt{2}}\begin{bmatrix} 1 \\ j \end{bmatrix}, \frac{1}{\sqrt{2}}\begin{bmatrix} 1 \\ -j \end{bmatrix} \right\}.$$

This codebook forms a mutually unbiased basis or Kerdock code (see T. Inoue and R. W. Heath Jr., "Kerdock codes for limited feedback MIMO systems," Mar. 30-Apr. 4, 2008, Proc. of the IEEE Int. Conf. on Acoustics, Speech, and Signal Proc., Las Vegas, Nev., for example) and has also been employed for use in prior work without progressive quantization (see Samsung, "Codebook design for 4tx SU MIMO," 3GPP TSG RAN WG1 49, Kobe, Japan, 7-11 May, 2007). It has the property that each pair of vectors forms an orthogonal matrix and vectors from each bases pair have inner product $1/\sqrt{2}$.

A preferred embodiment for base codebook 305 for three transmit antennas is $$F_{Kerdock,3} = \frac{1}{\sqrt{3}} \left\{ \begin{bmatrix} 1 \\ 1 \\ 1 \end{bmatrix}, \begin{bmatrix} 1 \\ e^{j2\pi/3} \\ e^{j4\pi/3} \end{bmatrix}, \begin{bmatrix} 1 \\ e^{j4\pi/3} \\ e^{j2\pi/3} \end{bmatrix}, \begin{bmatrix} 1 \\ e^{j2\pi/3} \\ e^{j2\pi/3} \end{bmatrix}, \right.$$

$$\left. \begin{bmatrix} 1 \\ e^{j4\pi/3} \\ 1 \end{bmatrix}, \begin{bmatrix} 1 \\ 1 \\ e^{j4\pi/3} \end{bmatrix}, \begin{bmatrix} 1 \\ e^{j4\pi/3} \\ e^{j4\pi/3} \end{bmatrix}, \begin{bmatrix} 1 \\ e^{j2\pi/3} \\ 1 \end{bmatrix}, \begin{bmatrix} 1 \\ 1 \\ e^{j2\pi/3} \end{bmatrix}, \begin{bmatrix} 3 \\ 0 \\ 0 \end{bmatrix}\begin{bmatrix} 0 \\ 3 \\ 0 \end{bmatrix}\begin{bmatrix} 0 \\ 0 \\ 3 \end{bmatrix} \right\}.$$

Note that this codebook, except for the identity, consists of permutations of a 3×3 DFT matrix, thus inner products can be computed efficiently using a Fourier algorithm.

A preferred embodiment for base codebook 305 for four transmit antennas is $$F_{3GPP,4} =$$

$$\frac{1}{2}\left\{ \begin{bmatrix} 1 \\ -1 \\ -1 \\ -1 \end{bmatrix}, \begin{bmatrix} 1 \\ -j \\ 1 \\ j \end{bmatrix}, \begin{bmatrix} 1 \\ 1 \\ -1 \\ 1 \end{bmatrix}, \begin{bmatrix} 1 \\ j \\ 1 \\ -j \end{bmatrix}, \begin{bmatrix} 1 \\ (-1-j)/\sqrt{2} \\ -j \\ (1-j)/\sqrt{2} \end{bmatrix}, \begin{bmatrix} 1 \\ (1-j)/\sqrt{2} \\ j \\ (-1+j)/\sqrt{2} \end{bmatrix}, \right.$$

$$\begin{bmatrix} 1 \\ (1+j)/\sqrt{2} \\ -j \\ (-1+j)/\sqrt{2} \end{bmatrix}, \begin{bmatrix} 1 \\ (-1+j)/\sqrt{2} \\ j \\ (1+j)/\sqrt{2} \end{bmatrix}, \begin{bmatrix} 1 \\ -1 \\ 1 \\ 1 \end{bmatrix}, \begin{bmatrix} 1 \\ -j \\ -1 \\ -j \end{bmatrix}, \begin{bmatrix} 1 \\ 1 \\ 1 \\ -1 \end{bmatrix},$$

$$\left. \begin{bmatrix} 1 \\ j \\ -1 \\ j \end{bmatrix}, \begin{bmatrix} 1 \\ -1 \\ -1 \\ 1 \end{bmatrix}, \begin{bmatrix} 1 \\ -1 \\ 1 \\ -1 \end{bmatrix}, \begin{bmatrix} 1 \\ 1 \\ -1 \\ -1 \end{bmatrix}, \begin{bmatrix} 1 \\ 1 \\ 1 \\ 1 \end{bmatrix} \right\}.$$

An alternative embodiment base codebook 305 that has slightly better theoretical properties for four transmit antennas is based on the mutually unbiased bases or Kerdock code is $$F_{Kerdock,4} = \frac{1}{2}\left\{ \begin{bmatrix} 2 \\ 0 \\ 0 \\ 0 \end{bmatrix}, \begin{bmatrix} 0 \\ 2 \\ 0 \\ 0 \end{bmatrix}, \begin{bmatrix} 0 \\ 0 \\ 2 \\ 0 \end{bmatrix}, \begin{bmatrix} 0 \\ 0 \\ 0 \\ 2 \end{bmatrix}, \begin{bmatrix} -j \\ 1 \\ -j \\ -1 \end{bmatrix}, \right.$$

$$\begin{bmatrix} -j \\ -1 \\ -j \\ 1 \end{bmatrix}, \begin{bmatrix} -j \\ 1 \\ j \\ 1 \end{bmatrix}, \begin{bmatrix} -j \\ -1 \\ j \\ -1 \end{bmatrix}, \begin{bmatrix} -1 \\ -j \\ -j \\ 1 \end{bmatrix}, \begin{bmatrix} -1 \\ -j \\ j \\ -1 \end{bmatrix}, \begin{bmatrix} -j \\ -1 \\ -1 \\ j \end{bmatrix}, \begin{bmatrix} j \\ 1 \\ -1 \\ j \end{bmatrix},$$

$$\left. \begin{bmatrix} -1 \\ -1 \\ j \\ -j \end{bmatrix}, \begin{bmatrix} j \\ j \\ -1 \\ 1 \end{bmatrix}, \begin{bmatrix} j \\ -j \\ -1 \\ -1 \end{bmatrix}, \begin{bmatrix} 1 \\ -1 \\ -j \\ -j \end{bmatrix}, \begin{bmatrix} j \\ j \\ j \\ j \end{bmatrix}, \begin{bmatrix} 1 \\ -1 \\ -1 \\ 1 \end{bmatrix}, \begin{bmatrix} j \\ j \\ -1 \\ -1 \end{bmatrix}, \begin{bmatrix} -1 \\ 1 \\ 1 \\ -1 \end{bmatrix} \right\}.$$

Localized codebook 310, as shown FIG. 4b, is one that is not uniform. More specifically it is a codebook of $N_1$ vectors with the same norm $S=\{e_1, w_0, \ldots, w_{N_1-2}\}$ that satisfy the following property. The root of the codebook is the $N_t \times 1$ vector $$e_1 = \begin{bmatrix} 1 \\ 0 \\ \vdots \\ 0 \end{bmatrix}.$$

The embodiment of the root vector is chosen in this way to facilitate a computationally simple implementation but it will be clear to those skilled in that art that any root vector may be chosen. Defining the subspace distance between unit norm vectors a and b as $d(a,b)=\sqrt{1-|a^*b|^2}$, a localized codebook satisfies the property that $d(e_1,w_n) \leq K$ for some positive constant K and $d(e_1,w_n) > 0$ for $n=0, \ldots N_1-2$. In an embodiment of the localized codebook, the root of the codebook is the centroid of the remaining vectors meaning that $$\min_{e, \|e\|=1} \sum_{n=0}^{N_l-2} d^2(e, w_n) > 0$$

is $e_1$. In this way the root vector is the centroid of the localized codebook (shown in FIG. 4b as point 410).

A preferred embodiment for local codebook 310 is a ring codebook, which is conceptually illustrated in FIG. 4b. The ring codebook has the additional property that $d(e_1,w_n)=\gamma_0$ for $n=0, \ldots N_1-2$. This means that all the non-root vectors are equidistant from the root vector.

For two transmit antennas a preferred embodiment of the ring codebook has vectors of the form $$w_\ell = \begin{bmatrix} \sqrt{1-\gamma_0^2} \\ \gamma_0 e^{j\theta_\ell} \end{bmatrix}$$

with a set of uniform phases $$\theta_\ell = \frac{2\pi \ell}{N_l - 1}$$

for $l=0, 1, \ldots, N_l-2$. This choice of phases maximizes the minimum distance between vectors in $\{w_n\}_{n=0}^{N_l-2}$ which is a good property of a ring codebook.

A specific codebook that is especially easy to store and scale as $\gamma_0=1/\sqrt{2}$. Then with $N_l=4$ a preferred embodiment for the ring codebook is $$S_2 = \left\{ \begin{bmatrix} 1 \\ 0 \end{bmatrix}, \frac{1}{\sqrt{2}} \begin{bmatrix} 1 \\ 1 \end{bmatrix}, \frac{1}{\sqrt{2}} \begin{bmatrix} 1 \\ j \end{bmatrix}, \frac{1}{\sqrt{2}} \begin{bmatrix} 1 \\ -1 \end{bmatrix}, \frac{1}{\sqrt{2}} \begin{bmatrix} 1 \\ -j \end{bmatrix} \right\}.$$

Another preferred embodiment for the ring codebook builds a ring using a smaller uniform base codebook. In this case the vectors of the ring have the form $$w_\ell = \begin{bmatrix} \sqrt{1-\gamma_0^2} \\ \tilde{w}_\ell \gamma_0 e^{j\theta_\ell} \end{bmatrix}$$

with a set of uniform phases $$\theta_\ell = \frac{2\pi \ell}{N_l - 1}$$

for $l=0, 1, \ldots, N_l-2$, where the collection of vectors is chosen from any good set of base vectors for example Grassmannian codebooks. This permits some storage savings since a base codebook for two antennas can be used to build a localized ring codebook for three antennas.

A preferred embodiment for three transmit antennas is the ring codebook $$S_3 = \frac{1}{\sqrt{3}} \left\{ \begin{bmatrix} 3 \\ 0 \\ 0 \end{bmatrix}, \begin{bmatrix} 1 \\ 1 \\ 1 \end{bmatrix}, \begin{bmatrix} 1 \\ e^{j2\pi/3} \\ e^{j4\pi/3} \end{bmatrix}, \begin{bmatrix} 1 \\ e^{j4\pi/3} \\ e^{j2\pi/3} \end{bmatrix}, \begin{bmatrix} 1 \\ e^{j2\pi/3} \\ e^{j2\pi/3} \end{bmatrix}, \begin{bmatrix} 1 \\ e^{j4\pi/3} \\ 1 \end{bmatrix}, \begin{bmatrix} 1 \\ 1 \\ e^{j4\pi/3} \end{bmatrix}, \begin{bmatrix} 1 \\ e^{j4\pi/3} \\ e^{j4\pi/3} \end{bmatrix}, \begin{bmatrix} 1 \\ 1 \\ e^{j4\pi/3} \end{bmatrix} \right\}.$$

This codebook has $$\gamma_0 = \sqrt{\frac{2}{3}}$$

and has nice distance properties. In particular $$d(e_1, w_n) = \sqrt{\frac{2}{3}}$$

for $n=0, \ldots, 9$ and for $k,n=0, \ldots, 9$, $k \neq n$ $$d(w_k, w_n) = \begin{cases} \sqrt{\frac{2}{3}} \text{ or} \\ 1 \end{cases}.$$

This means that the vectors in the ring also have good distance properties.

For four transmit antennas, a preferred embodiment of the ring codebook with $$\gamma_0 = \frac{\sqrt{3}}{2}$$

is $$S_4 = \frac{1}{2} \left\{ \begin{bmatrix} 2 \\ 0 \\ 0 \\ 0 \end{bmatrix}, \begin{bmatrix} -j \\ 1 \\ -j \\ -1 \end{bmatrix}, \begin{bmatrix} -j \\ -1 \\ -j \\ 1 \end{bmatrix}, \begin{bmatrix} -j \\ 1 \\ j \\ 1 \end{bmatrix}, \begin{bmatrix} -j \\ -1 \\ j \\ -1 \end{bmatrix}, \begin{bmatrix} -1 \\ -j \\ -j \\ 1 \end{bmatrix}, \begin{bmatrix} -1 \\ -j \\ j \\ -1 \end{bmatrix}, \begin{bmatrix} -j \\ -1 \\ -1 \\ j \end{bmatrix}, \begin{bmatrix} j \\ 1 \\ -1 \\ j \end{bmatrix}, \begin{bmatrix} -1 \\ -1 \\ j \\ -j \end{bmatrix}, \begin{bmatrix} j \\ j \\ -1 \\ 1 \end{bmatrix}, \begin{bmatrix} j \\ -j \\ -1 \\ -j \end{bmatrix}, \begin{bmatrix} 1 \\ -1 \\ -j \\ -j \end{bmatrix}, \right.$$

$$\left. \begin{bmatrix} j \\ j \\ j \\ j \end{bmatrix}, \begin{bmatrix} 1 \\ -1 \\ -1 \\ 1 \end{bmatrix}, \begin{bmatrix} j \\ j \\ -j \\ -j \end{bmatrix}, \begin{bmatrix} -1 \\ 1 \\ 1 \\ -1 \end{bmatrix} \right\}.$$

In particular note that $$d(e_1, w_n) = \sqrt{\frac{2}{3}}$$

for n=0, . . . , 15 and for k,n=0, . . . , 15, k≠n $$d(w_k, w_n) = \begin{cases} \sqrt{\frac{3}{2}} \text{ or} \\ 1 \end{cases}.$$

The embodiments of ring codebooks $S_2$, $S_3$, and $S_4$ all contain a subset of vectors in the mutually unbiased bases or Kerdock code. Thus other preferred embodiments can be constructed for larger numbers of transmit antennas from the corresponding mutually unbiased bases, as is apparent to those skilled in the art. Also, it should be apparent that if the mutually unbiased bases were chosen for the base codebook that a subset of the vectors could be used for the localized codebook. Thus the localized codebook could be a subset of the base codebook, offering savings in terms of storage and memory.

Figure 5A:
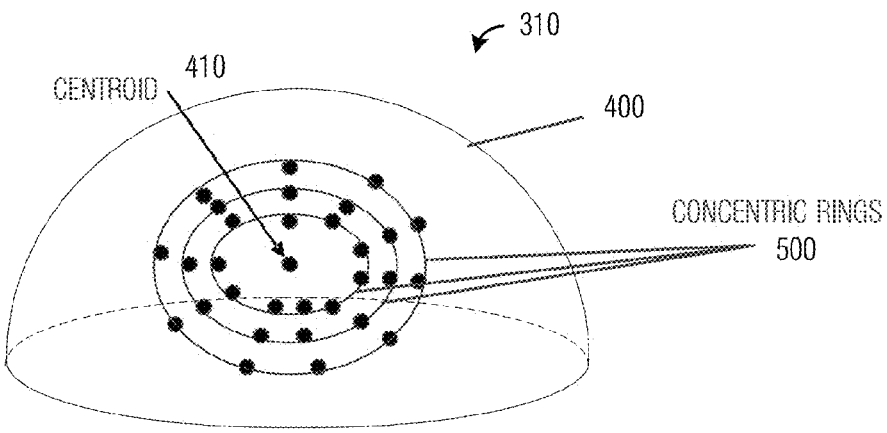
FIG. 5a is an diagram of a localized codebook with concentric rings.
Figure 5B:
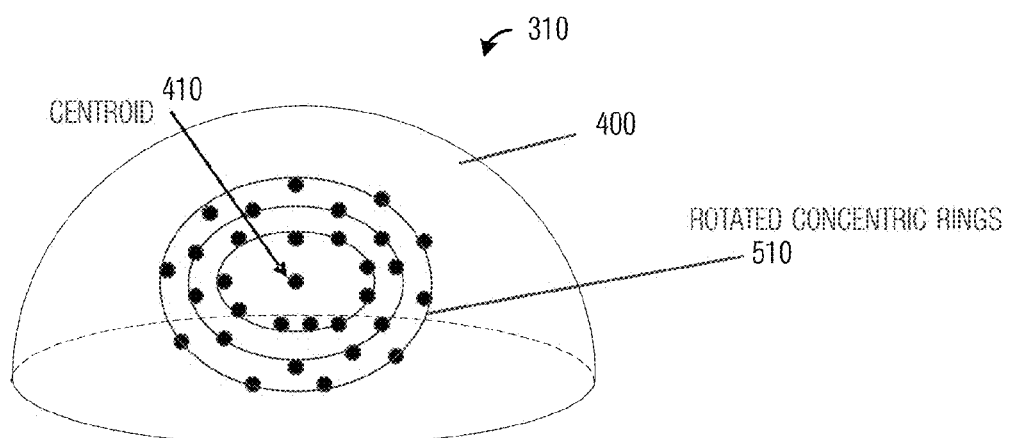
FIG. 5b is an diagram of a localized codebook with concentric rings with rotation.
Figure 5C:
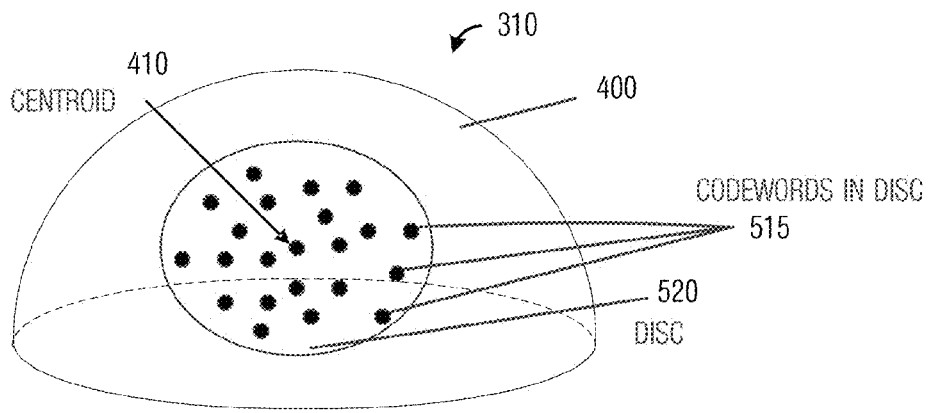
FIG. 5c is an diagram of a localized codebook with a disc.

Though localized ring codebooks are preferred, other localized codebooks may also be employed by embodiments. FIG. 5a illustrates a localized concentric ring codebook. The localized concentric ring codebook has multiple concentric rings 500 of vector codewords in addition to centroid 410. Rings 500 have different radii. FIG. 5b illustrates another localized codebook. The localized codebook shown in FIG. 5b has several rotated rings 510 of vector codewords in addition to the centroid 410. Rings 510 are rotated to have a larger maximum minimum distance and improve performance, for example. FIG. 5c illustrates yet another localized codebook. The localized codebook shown in FIG. 5c has vectors 515 that all belong inside a disc 520. This has the advantage of potentially having a larger maximum minimum distance between code vectors.

Figure 6A:
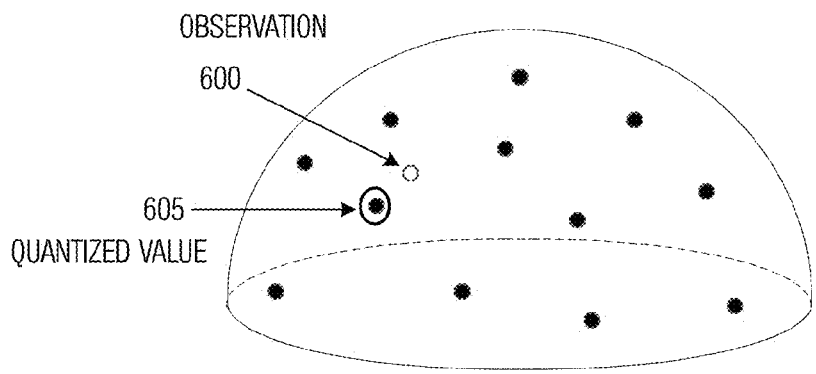
FIG. 6a is a diagram of quantization by a base codebook.
Figure 6B:
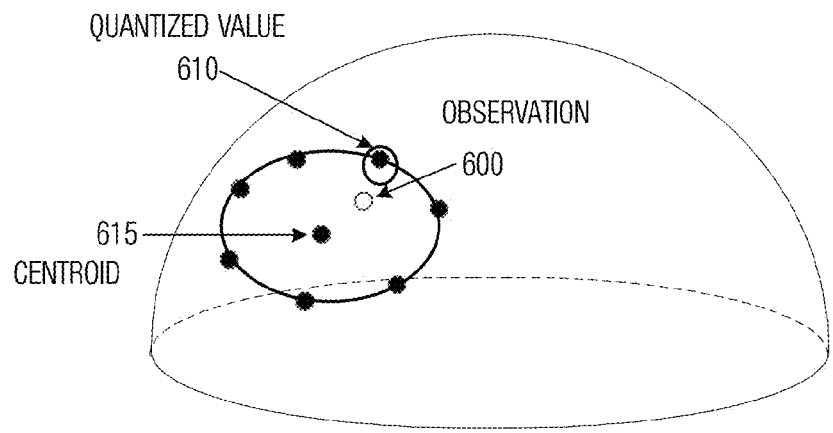
FIG. 6b is a diagram of a first refinement quantization by a localized codebook.
Figure 6C:
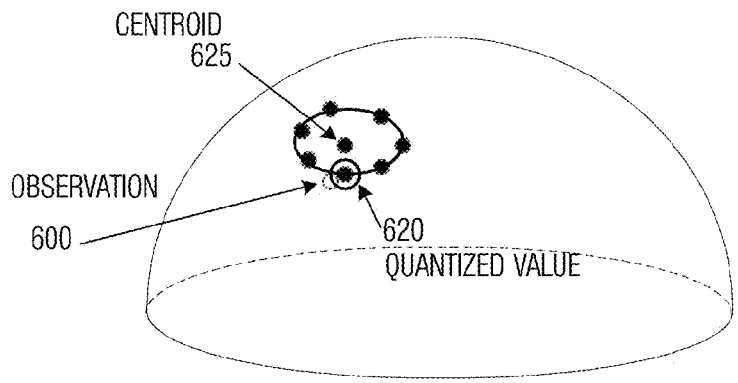
FIG. 6c is a diagram of a second refinement quantization by a localized codebook.

FIGS. 6a through 6c illustrates the operation of progressive quantization block 330, which exploits the special structure given by the base codebook and the localized codebook. The diagrams shown in FIGS. 6a through 6c are intended to provide a conceptual illustration of the embodiments. As shown in FIG. 6a, an observation 600 may be quantized into a quantization value using base codebook 305. Then, as shown in FIG. 6b, a localized ring codebook is rotated so that the root vector aligns with the quantized value 605 and the quantization with the localized ring codebook is performed over the vectors in the rotated ring, resulting in a new quantized value 610. This is the output of the first refinement.

In the next refinement, as shown in FIG. 6c, the localized ring codebook is scaled so that the radius is smaller and the quantization process repeats, producing another new quantized value 620. The refinement process may be repeated for an arbitrary number of refinements to produce quantized values that converge towards observation 600.

The output of progressive quantization block 330 consists of an index in the base codebook and several refinement indices that correspond to the localized codebook, with the number of refinement indices being dependent on the number of times the refinement was performed.

Figure 7A:
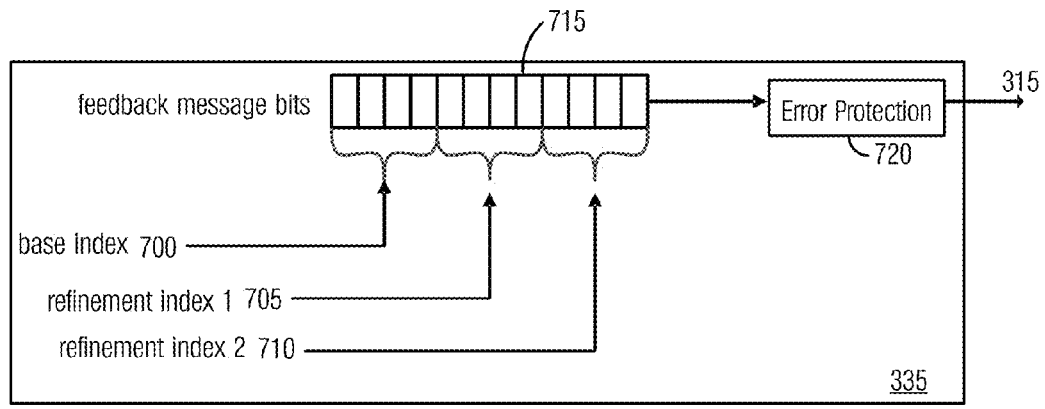
FIG. 7a is a block diagram of a circuit for use in the generation of a feedback message.

FIG. 7a illustrates the generation of feedback message bits from the codebook indices. Progressive feedback block 335 can combine the codebook indices in several different ways to produce a feedback message. In one embodiment, a base index 700 and refinement index one 705 and refinement index two 710 are concatenated together to form a single feedback message 715. Additional error protection 720 may be employed to provide resilience to errors in the feedback channel.

Figure 7B:
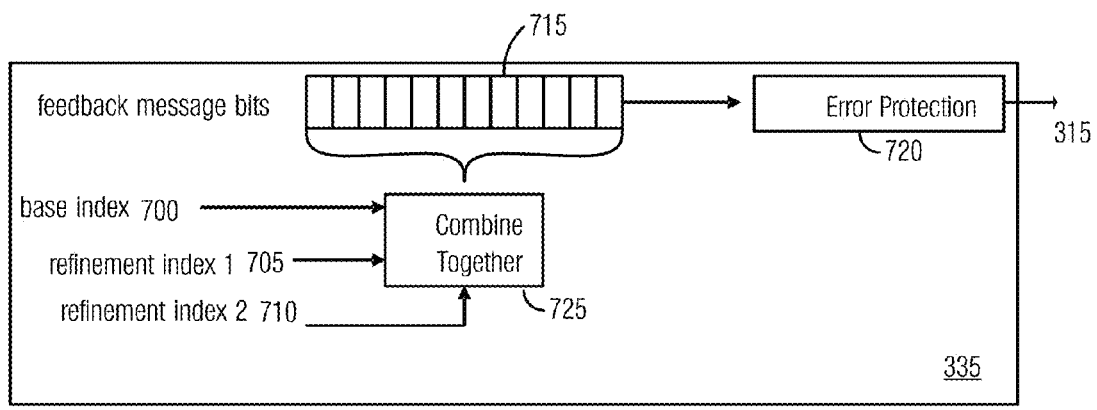
FIG. 7b is a block diagram of a circuit for use in the generation of a feedback message.

FIG. 7b illustrates the generation of feedback message bits from the codebook indices. In another embodiment, base index 700, refinement index 705, and refinement index two 710 are combined together in a combine block 725 to produce a potentially shorter feedback message 715. The advantage of this embodiment is that it reduces the amount of feedback required when the size of the localized codebook is not a power of two. It will be clear to those skilled in the art that multiple refinements may similarly be included in the feedback message in either preferred embodiment. Again, error protection 720 may be employed to provide resilience to errors in the feedback channel.

The application of the error protection to the feedback message 715 may provide a different level of error protection for different codebook indices. For example, the base index may be given the highest level of error protection, while the refinement indices may be given a lower level of error protection. Alternatively, the level of error protection may progressively decrease for each level of refinement. In yet another alternative, error protection may be given to a specified number of refinement indices (in addition to the base index) and any additional refinement indices may be transmitted without error protection.

A preferred embodiment of progressive quantization block 330 uses localized codebook scaling and rotation operations. Let U(v) be the function that determines a unitary matrix that rotates vector v to the root vector $e_1$ thus $e_1$=U(v)v. In a preferred embodiment such a rotation matrix is computed from the singular value decomposition of v; in another embodiment it is computed using successive Given's rotations. It will be necessary to rotate the codebook to align it with a vector v. Define the rotated version of localized codebook S as $$r(S,v) = \{U(v)e_1, U(v)w_0, U(v)w_1, \ldots, U(v)w_{N_j-2}\}.$$

It will also be necessary to scale diameter of the localized codebook from radius $\gamma_0$ by $\gamma$ to produce a localized codebook $\gamma\gamma_0$. Define the vector scaling operation as follows: Write the coefficients of a vector w using polar form as $$w = \begin{bmatrix} r_1 e^{j\theta_1} \\ r_2 e^{j\theta_2} \\ \vdots \\ r_{N_t} e^{j\theta_{N_t}} \end{bmatrix}.$$

Now define the scaling function of w as $$s(w, \alpha) = \begin{bmatrix} \sqrt{1 - \alpha^2(1 - r_1^2)} \, e^{j\theta_1} \\ \alpha r_2 e^{j\theta_2} \\ \vdots \\ \alpha r_{M_t} e^{j\theta_{M_t}} \end{bmatrix}.$$

Now define the localized codebook scaling function as $s(S,\gamma)=S(\gamma)=\{s(e_1,\gamma), s(w_0,\gamma), s(w_1,\gamma), \ldots, s(w_{N_j-2},\gamma)\}$. Note that the scaling operation is such that $s(e_1,\gamma)=e_1$ and that $d(e_1,s(w_n,\gamma))=\gamma\gamma_0$ for $w_n$ that are in a localized ring codebook of radius $\gamma_0$.

FIG. 8a illustrates a flow diagram of operations 802 in progressive quantization block 330. Operations 802 may begin with the estimating of the channel to produce a channel estimate (block 805). The estimating of the channel may be performed by estimate channel block 255. After estimating the channel, the channel estimate may be normalized and quantized using the base codebook (block 807).

Let h denote the vector of channel coefficients that have been normalized to have $\|h\|=1$. Then in one preferred embodiment the intial base quantization is performed by solving $$f_0^\# = \min_{f \in F} d(h, f)$$

where F is the base codebook. The index of the base codebook is produced by solving $$k_0 = \min_{n=0,\ldots,N-1} d(h, f_n).$$

After performing the base quantization, operations 802 may perform a number, such as R refinements. In general, for an $r^{th}$ refinement stage, operations 802 includes scaling the localized codebook to produce scaled codebook $S_s = s(S, \gamma^{2r})$ (block 809). Then the scaled codebook is rotated to align with the previously quantized value (block 811).

For example, in the first refinement the scaled codebook is rotated to produce $S_r = r(S_s, f_0^\#)$. Then the scaled and rotated localized codebook is used to produce the next best refinement solving $$f_1^\# = \min_{f \in S_r} d(h, f)$$

and index of the first refinement is produced by solving $$k_1 = \min_{n=0,\ldots,N_l-2,\, f_n \in S_r} d(h, f_n)$$

(block 813). The $r^{th}$ refinement $f_r^\#$ is computed using $f_{r-1}^\#$ from the previous stage and the output is $f_r^\#$ and $k_r$. Operations 802 may loop until all R refinements are complete (block 815).

FIG. 8b illustrates a flow diagram of operations 817 in progressive quantization block 330. Operations 817 may begin with the estimating of the channel to produce a channel estimate (block 820). The estimating of the channel may be performed by estimate channel block 255. After estimating the channel, the channel estimate may be normalized and quantized using the base codebook (block 822).

Let h denote the vector of channel coefficients that have been normalized to have $\|h\|=1$. Then in one preferred embodiment the intial base quantization is performed by solving $$f_0^\# = \min_{f \in F} d(h, f)$$

where F is the base codebook. The index of the base codebook is produced by solving $$k_0 = \min_{n=0,\ldots,N-1} d(h, f_n).$$

After performing the base quantization, operations 817 may perform a number, such as R, of refinements. In general, for an $r^{th}$ refinement stage, operations 817 includes scaling the localized codebook to produce scaled codebook $S_s = s(S, \gamma^{2r})$ (block 824). Then, instead of rotating the scaled localized codebook, the observed vector is rotated as $U^*(f_{r-1}^\#)h$, where $U^*(f_{r-1}^\#)$ is the conjugate transpose of $U(f_{r-1}^\#)$ (block 826). Then the scaled localized codebook is used to produce the next best refinement solving $$f_r^\# = \min_{f \in S_r} d(U^*(f_{r-1}^\#)h, f)$$

and index of the first refinement is produced by solving $$k_r = \min_{n=0,\ldots,N_l-2,\, f_n \in S_r} d(U^*(f_{r-1}^\#)h, f_n)$$

(block 828). This approach has an implementation advantage in that computations to rotate the scaled codebook are not required. Operations 817 may loop until all R refinements are complete (block 830).

FIG. 8c illustrates a flow diagram of operations 832 in progressive quantization block 330. Operations 832 may begin with the estimating of the channel to produce a channel estimate (block 835). The estimating of the channel may be performed by estimate channel block 255. After estimating the channel, the channel estimate may be normalized and quantized using the base codebook (block 837).

Let h denote the vector of channel coefficients that have been normalized to have $\|h\|=1$. Then in one preferred embodiment the initial base quantization is performed by solving $$f_0^\# = \min_{f \in F} d(h, f)$$

where F is the base codebook. The index of the base codebook is produced by solving $$k_0 = \min_{n=0,\ldots,N-1} d(h, f_n).$$

After performing the base quantization, operations 832 may perform a number, such as R refinements. In general, for an $r^{th}$ refinement stage, operations 832 includes scaling the observation vector (block 839). Define a scaled version of vector w as $$t(w, \alpha) = \begin{bmatrix} \sqrt{1-\alpha^2(1-1/J)}\, w^{(1)} \\ \alpha \tilde{w} \end{bmatrix} \text{ where } w = \begin{bmatrix} w^{(1)} \\ \tilde{w} \end{bmatrix}$$

and $w^{(1)}$ is the first entry of w. Then, form the scaled input vector $h_s = t(h, \gamma^{2r})$. Then, form the rotated vector $U^*(f_{r-1}^\#)h_s$ (block 841). Finally, the localized codebook is used to produce the next best refinement solving $$f_r^\# = \min_{f \in S} d(U^*(f_{r-1}^\#)h_s, f)$$

and index of the first refinement is produced by solving $$k_r = \min_{n=0,\ldots,N_l-2, f_n \in S} d(U^*(f_{r-1}^\#)h_s, f_n)$$

(block 843). This approach has an implementation advantage in that scaling of the codebook is also not required thus further lowering the complexity. Operations 832 may loop until all R refinements are complete (block 845).

Figure 8D:
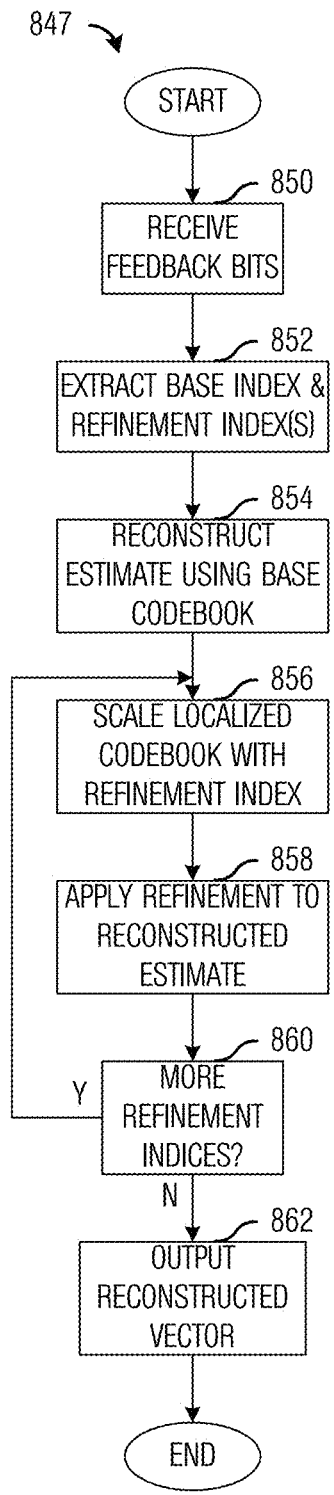
FIG. 8d is a flow chart of base station operations in the reconstruction of channel state from feedback information.

FIG. 8d illustrates a flow diagram of operations 847 in progressive reconstruction block 300. Operations 847 may begin receiving channel quality information feedback (or feedback bits) from a receiver (block 850). From the channel quality information feedback, a base index and refinement index(s) may be extracted (block 852). The base and refinement indices may be denoted $k_0, k_1, \ldots, k_R$. Let $f_{k_0}$ denote the vector chosen from the base codebook and let $z_{k_r}$ denote the vector chosen from the scaled localized codebook $s(S, \gamma^{2r})$. Then the reconstructed estimate of the quantized normalized vector h is computed as $\hat{h} = U(\ldots U(U(f_{k_0})z_{k_1})z_{k_2}\ldots)z_{k_R})$ (block 854).

Then, operations 847 may perform a number, such as R, of refinements. In general, for an $r^{th}$ refinement stage, operations 847 includes using the previous refinement, denoted by $\hat{h}_{r-1}$, to produce $\hat{h}_r = U(\hat{h}_{r-1})z_{k_r}$, which includes scaling the localized codebook by the $r^{th}$ refinement index and applying the $r^{th}$ refinement to the reconstructed estimate (blocks 856 and 858). The final output is $\hat{h} = \hat{h}_R$ produced after all R refinements have been performed (blocks 860 and 862).

It will be obvious to those of ordinary skill in the art that this is just one example of a way to reconstruct the quantized vector. For example, the scaled localized codebooks used in block 839 could be precomputed. Several different techniques can be used to solve for the rotation vector including the singular value decomposition and Givens rotations.

The scaling factor $\gamma$ is a parameter of the progressive refinement algorithm. To perform reconstruction it should be known at the transmitter and the receiver. In a preferred embodiment $\gamma = \gamma_0$.

The base codebook 305 and localized codebook 310 must be known both at the BTS and at each subscriber unit. These codebooks could be pre-designed or they could be dynamically downloaded in the system. They can also be precomputed and stored in memory, or they may be computed dynamically according to some mathematical algorithm, as known to those of ordinary skill in the art. In a preferred embodiment, the localized codebook is derived by taking a subset of vectors from the base codebook. This reduces storage requirements even further.

The number of refinements R used in the progressive refinement algorithm determines the amount of feedback required in the system. The larger the value of R, the larger the amount of feedback required. In multi-user communication systems, different users could be assigned different values of R. For example, users with more mobile channels as determined by mobility estimate 325 may be assigned a smaller R while users with a less mobile channel may be assigned a larger value of R.

The mobility estimate generated from mobility estimate block 325 may be used to adjust the operation of the progressive quantization algorithm. In one preferred embodiment, the progressive quantization algorithm exploits slowly varying channels in time. It may do this by not starting the quantization using the base codebook, but by using the localized codebook at radius $\gamma^{2m}$ where the value of m is chosen based on the mobility estimate block 325. A larger value of m means the channel is more stationary thus a smaller region can be searched while a smaller value of m means that the channel is changing more quickly and thus a larger region must be explored. Using the progressive refinement algorithm as described, the subscriber can reduce the amount of feedback required. In a preferred embodiment only the value of m and the indices of the refinements from m, m+1, . . . R need to be fed back. This can reduce overall feedback requirements.

Figure 9:
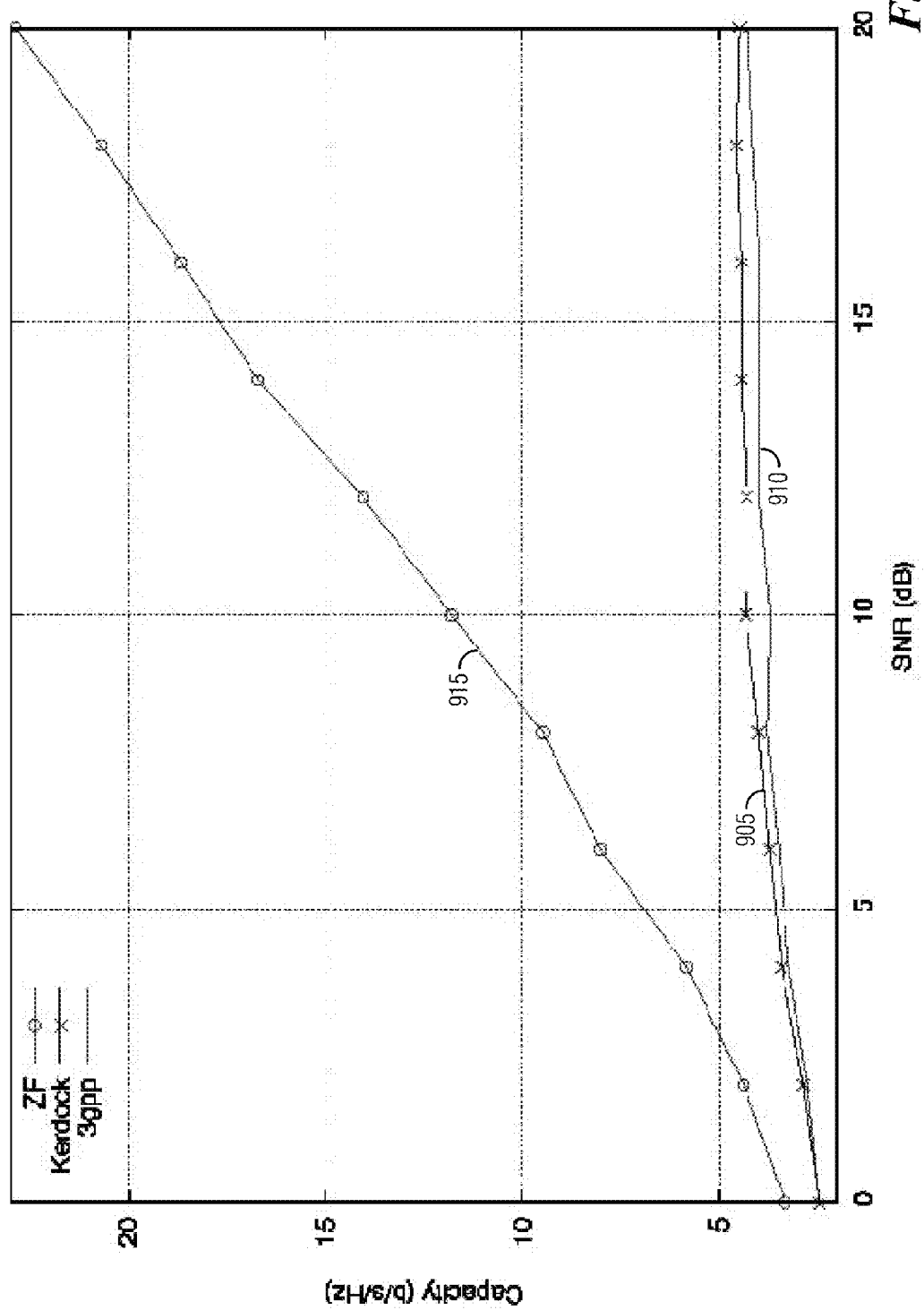
FIG. 9 is a data plot of the sum capacity performance for a two antenna base transceiver station with two subscriber stations as studied in prior art.
Figure 10:
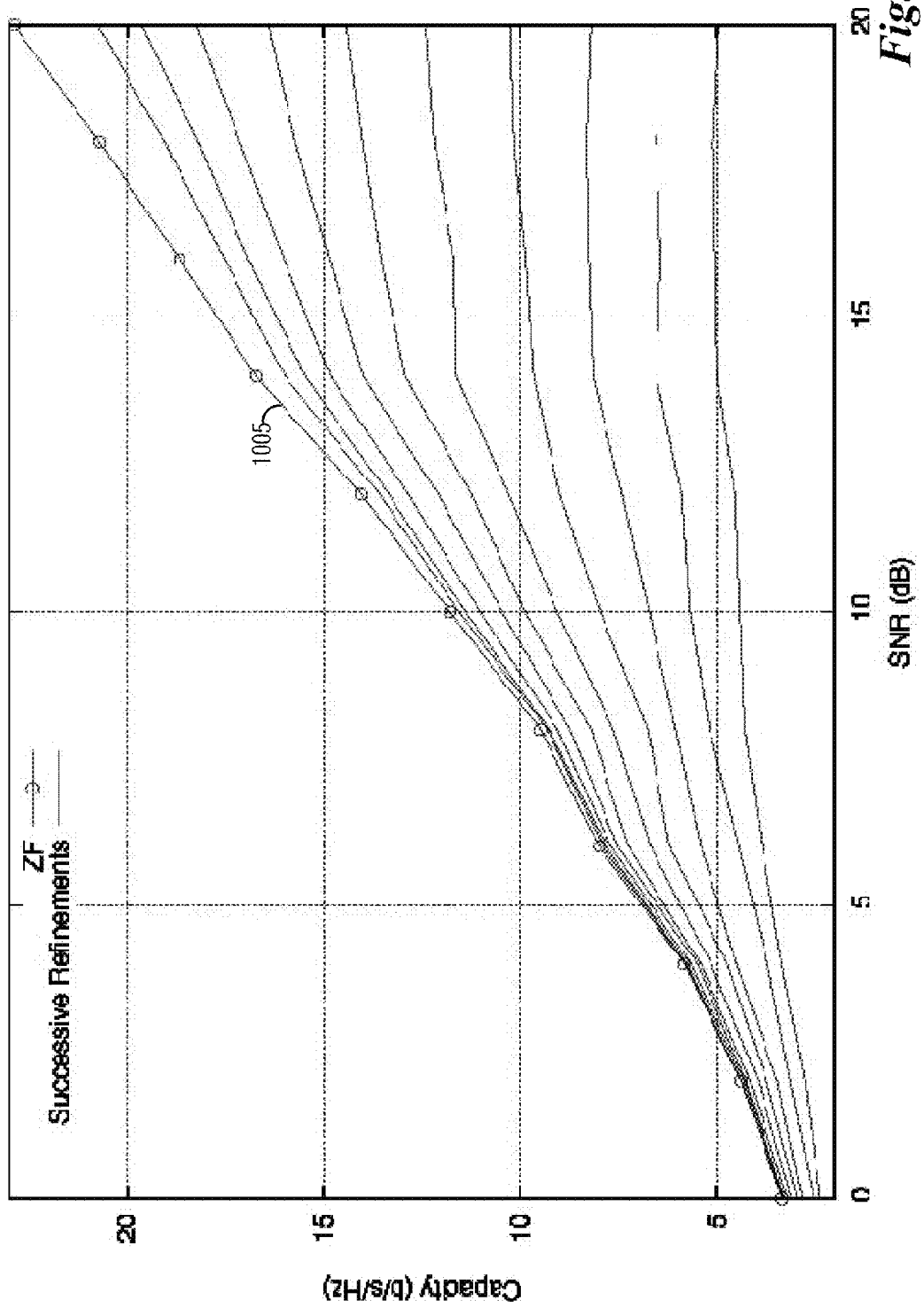
FIG. 10 is a data plot of increasing performance for a two antenna base transceiver station with two subscriber stations using embodiments of the present invention.

FIG. 9 illustrates performance in terms of estimated sum rate for a communication system with two transmit antennas at the base station and two subscriber units, assuming Rayleigh fading channels and zero-forcing transmit beamforming as used in N. Jindal, MIMO Broadcast Channels with Finite Rate Feedback, IEEE Trans. Information Theory, Vol. 52, No. 11, pp. 5045-5059, November 2006. Quantization using either the Kerdock code (displayed as a first trace 905) or the 3GPP code (displayed as a second trace 910) gives poor performance relative to the unquantized zero forcing solution (displayed as a third trace 915). FIG. 10 illustrates the improved performance obtained using the successive refinement algorithm. Additional refinements close the gap between quantization using the base codebook and the zero-forcing case with perfect channel state information (displayed as trace 1005).

Figure 11:
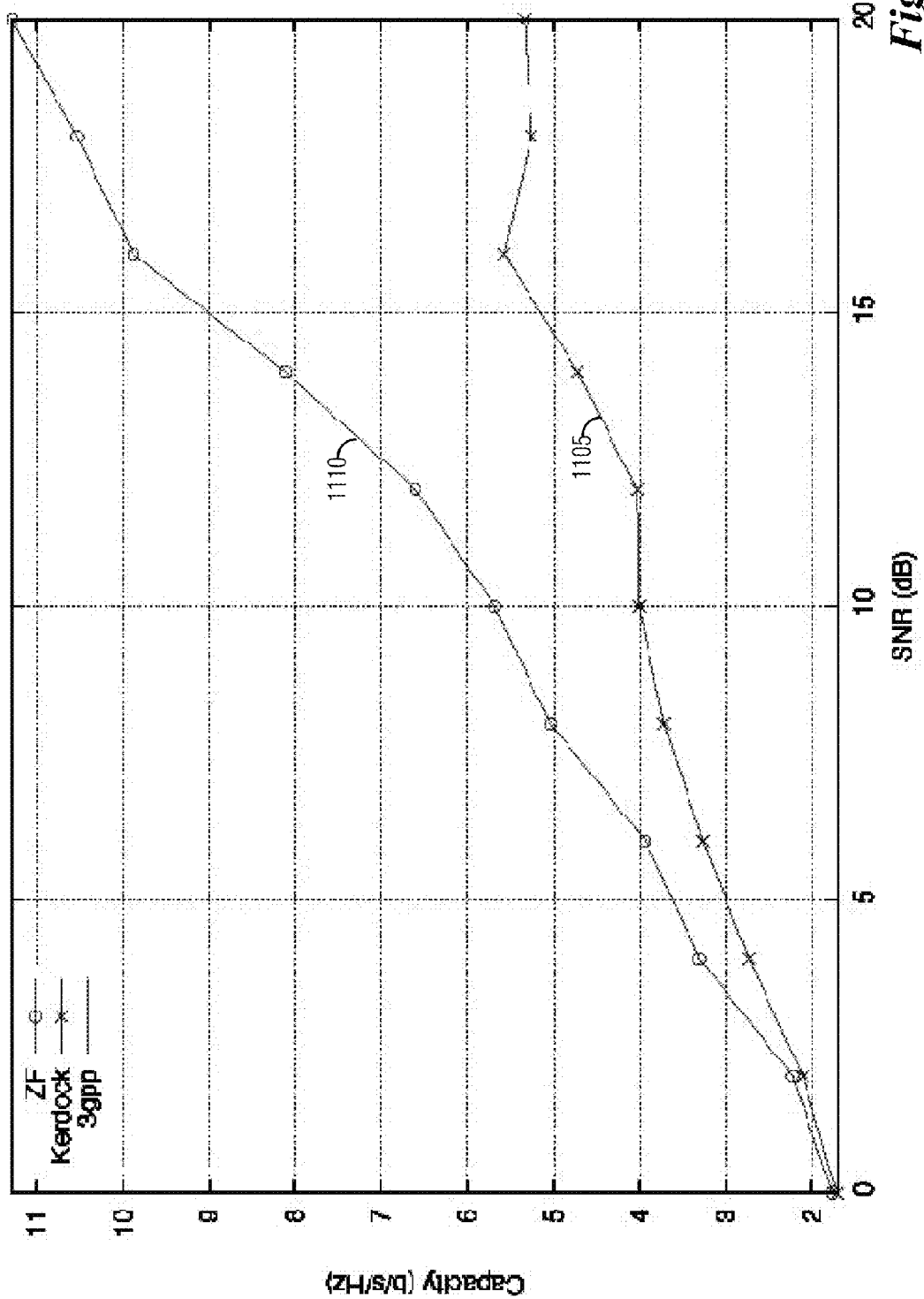
FIG. 11 is a data plot of the sum capacity performance for a four antenna base transceiver station with four subscriber stations as studied in prior art.
Figure 12:
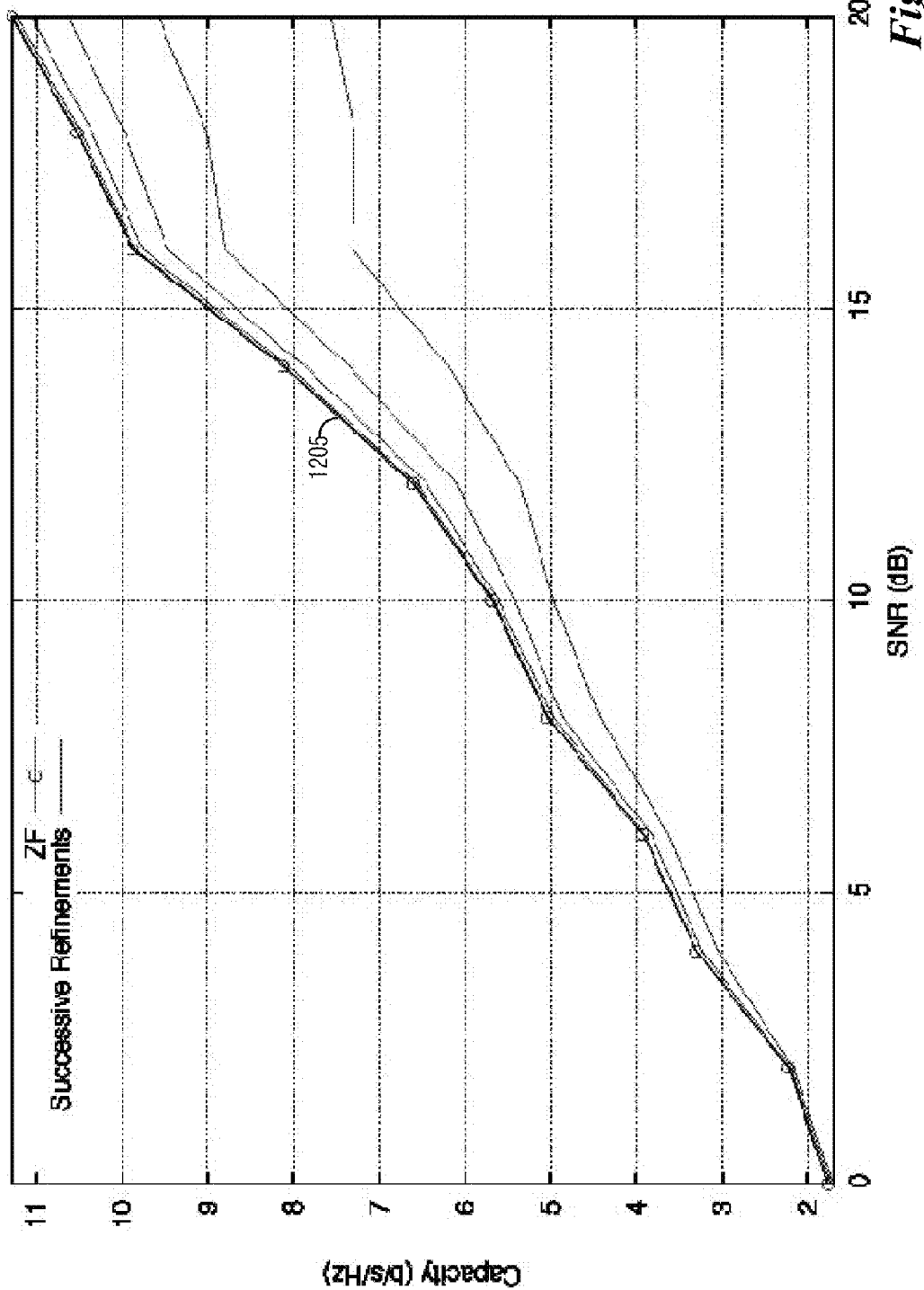
FIG. 12 is a data plot of increasing performance for a four antenna base transceiver station with four subscriber stations using embodiments of the present invention.

FIG. 11 illustrates performance in terms of estimated sum rate for a communication system with four transmit antennas at the base station and four subscriber units, assuming Rayleigh fading channels and zero-forcing transmit beamforming as used in N. Jindal, MIMO Broadcast Channels with Finite Rate Feedback, IEEE Trans. Information Theory, Vol. 52, No. 11, pp. 5045-5059, November 2006. Quantization using either the Kerdock code or the 3GPP code (displayed collectively as a first trace 1105) gives poor performance relative to the unquantized zero forcing solution (displayed as a second trace 1110). FIG. 12 illustrates the improved performance obtained using the successive refinement algorithm. Additional refinements close the gap between quantization using the base codebook and the zero-forcing case with perfect channel state information (displayed as trace 1205) as with the two antenna case.

Embodiments may be used in a variety of contexts. MIMO communication, where multiple antennas are used at the transmitter and receiver, is a relatively new technology. While it is deployed in wireless local area networks (WLANs), it is not as extensively deployed in cellular systems. It will likely be employed in the next release of HSDPA as well as in WiMax, 3PP LTE, and later IEEE 802.16m. Limited feedback has been discussed in several standards but has not yet been extensively deployed. One reason is probably the general skepticism associated with MIMO communication. Another reason is that limited feedback requires an accurate and low delay feedback link, which cannot always be guaranteed. 3GPP LTE, which has a codebook-based limited feedback mode, proposes to solve the limited feedback problem by choosing a vector from a predetermined codebook. The codebook is not localized nor is a progressive algorithm applied to improve quantization. Codebooks and algorithms for the multiuser case are not yet available.

Consequently, like adaptation has not been extensively deployed in interference limited cellular systems and real results on adaptation are not widely known. Existing systems perform link adaptation based on SNR and SINR measurements. It is likely that the same techniques will also be employed in MIMO cellular systems. Essentially only the estimated channel and the total interference power will be used to estimate the optimum transmit mode.

Summarizing a preferred embodiment, a system and method is proposed for progressively quantizing channel state information for application in a MIMO (multiple input multiple output) communication system. In what is commonly known as limited feedback, channel state information at the receiver is quantized by choosing a representative element from a codebook known to both the receiver and transmitter. Unfortunately, high resolution representation of the channel state information, as required with multiuser MIMO communication, is challenging due to the large size codebooks required.

Embodiments present a solution to this problem. Using a specially designed codebook, a receiver progressively quantizes the channel state information using a new method and conveys the results back to the transmitter. The transmitter can then reconstruct the quantized information with high precision. There are several key components of the proposed system including a progressive feedback control channel and progressive refinement operation. Preferred embodiments for single user and multiuser communication systems are described.

A system for limited feedback in a MIMO communication system that progressively refines quantization of a channel parameter has been described herein. The system includes a progressive refinement block that employs various algorithms. Preferred embodiments use the different codebooks described above. The number of refinement levels may be adjusted based on the users' channel conditions or other system dependent parameters. When a users channel is varying slowly, instead of sending back all the refinements, progressive refinement might initialize on the previous quantized value and only search over a few refinements. The number of refinements may depend on the operating SNR. This further reduces the feedback required. Feedback may be sent over dedicated channels or random access channels.

A system for limited feedback in a multiuser MIMO communication system progressively refines quantization of a channel parameter has been described herein. The system includes a progressive refinement block that employees the algorithms described above. Preferred embodiments use the different codebooks combined with zero-fording transmit precoding, e.g., as described in T. Yoo, N. Jindal, and A. Goldsmith, "Multi-antenna Downlink Channels with Limited Feedback and User Selection," IEEE J. Select. Areas Commun., vol. 25, no. 7, pp. 1478-1491, September 2007. Other types of precoding may be possible. The number of refinement levels may be adjusted based on the users' channel conditions or other system dependent parameters. For example, it is known from D. J. Ryan, I. V. L. Clarkson, I. B. Collins, D. Guo, and M. L. Honig, "QAM Codebooks for Low-Complexity Limited Feedback MIMO Beamforming," Proc. of ICC 2007, pp. 4162-4167 that for larger SNR, users require a larger codebook size while for smaller operating SNR, smaller codebooks may work. Scheduled users may be allocated more refinements while other users may be allocated fewer refinements. In general with scheduling, less feedback per user will be required. When a users channel is varying slowly, instead of sending back all the refinements, progressive refinement might initialize on the previous quantized value and only search over a few refinements. This further reduces the feedback required. Feedback may be sent over dedicated channels or random access channels.

A first embodiment includes a system for limited feedback in a MIMO communication system that progressively refines quantization of a channel parameter. This can include a 2 antenna localized codebook preferred design or a 4 antenna localized codebook based on preferred design, as examples. The system can adapt the number of refinements and feedback increments can be sent back.

A second embodiment includes a system for limited feedback in a multiuser MIMO communication system that progressively refines quantization of a channel parameter for each user. Once again, this can include a 2 antenna localized codebook preferred design or a 4 antenna localized codebook based on preferred design, as examples. The system can adapt the number of refinements and feedback increments can be sent back. Different numbers of refinements can be used for different users based on auxiliary information such as the degrees of mobility or location for each user. A scheduler determines the number of refinements.

In addition to using a separate base codebook and a separate localized codebook, it may be possible to use a composite codebook that combines both a base codebook and a localized codebook. Again, both the BTS and the subscriber station should have its own copy of the composite codebook. Table 1 shows an exemplary composite codebook.

TABLE 1

Composite Codebook (C(4, 1, 6, m))

| BINARY INDEX | M | C(4, 1, 6, m) | | | |
|---|---|---|---|---|---|
| 000000 | 0 | 0.5000 | −0.5000 | 0.5000 | −0.5000 |
| 000001 | 1 | −0.5000 | −0.5000 | 0.5000 | 0.5000 |
| 000010 | 2 | −0.5000 | 0.5000 | 0.5000 | −0.5000 |
| 000011 | 3 | 0.5000 | 0.0000 − 0.5000i | 0.5000 | 0.0000 − 0.5000i |
| 000100 | 4 | −0.5000 | 0.0000 − 0.5000i | 0.5000 | 0.0000 + 0.5000i |
| 000101 | 5 | −0.5000 | 0.0000 + 0.5000i | 0.5000 | 0.0000 − 0.5000i |
| 000110 | 6 | 0.5000 | 0.5000 | 0.5000 | 0.5000 |
| 000111 | 7 | 0.5000 | 0.0000 + 0.5000i | 0.5000 | 0.0000 + 0.5000i |
| 001000 | 8 | 0.5000 | 0.5000 | 0.5000 | −0.5000 |
| 001001 | 9 | 0.5000 | 0.0000 + 0.5000i | −0.5000 | 0.0000 + 0.5000i |
| 001010 | 10 | 0.5000 | −0.5000 | 0.5000 | 0.5000 |
| 001011 | 11 | 0.5000 | 0.0000 − 0.5000i | −0.5000 | 0.0000 − 0.5000i |
| 001100 | 12 | 0.5000 | 0.3536 + 0.3536i | 0.0000 + 0.5000i | −0.3536 + 0.3536i |
| 001101 | 13 | 0.5000 | −0.3536 + 0.3536i | 0.0000 − 0.5000i | 0.3536 + 0.3536i |
| 001110 | 14 | 0.5000 | −0.3536 − 0.3536i | 0.0000 + 0.5000i | 0.3536 − 0.3536i |
| 001111 | 15 | 0.5000 | 0.3536 − 0.3536i | 0.0000 − 0.5000i | −0.3536 − 0.3536i |
| 010000 | 16 | 0.5000 | −0.4619 − 0.1913i | 0.3536 + 0.3536i | −0.1913 − 0.4619i |
| 010001 | 17 | 0.3117 | 0.6025 + 0.1995i | −0.4030 − 0.4903i | −0.1122 − 0.2908i |

TABLE 1-continued

Composite Codebook (C(4, 1, 6, m))

| BINARY INDEX | M | | C(4, 1, 6, m) | |
|---|---|---|---|---|
| 010010 | 18 | 0.3117 | −0.6025 − 0.1995i | −0.1122 − 0.2908i | 0.4030 + 0.4903i |
| 010011 | 19 | 0.3058 | 0.1901 − 0.6052i | 0.1195 + 0.2866i | 0.4884 − 0.4111i |
| 010100 | 20 | 0.5000 | −0.1913 + 0.4619i | −0.3536 − 0.3536i | 0.4619 − 0.1913i |
| 010101 | 21 | 0.5000 | 0.1913 − 0.4619i | −0.3536 − 0.3536i | −0.4619 + 0.1913i |
| 010110 | 22 | 0.5000 | 0.4619 + 0.1913i | 0.3536 + 0.3536i | 0.1913 + 0.4619i |
| 010111 | 23 | 0.3082 | 0.0104 + 0.3151i | 0.4077 + 0.4887i | −0.4783 + 0.4145i |
| 011000 | 24 | 0.3117 | 0.3573 − 0.2452i | 0.6025 − 0.1995i | −0.1578 + 0.5360i |
| 011001 | 25 | 0.3117 | 0.2452 + 0.3573i | −0.6025 + 0.1995i | 0.5360 + 0.1578i |
| 011010 | 26 | 0.3082 | −0.3666 + 0.2426i | 0.6092 − 0.1842i | 0.1615 − 0.5298i |
| 011011 | 27 | 0.3117 | −0.2452 − 0.3573i | −0.6025 + 0.1995i | −0.5360 − 0.1578i |
| 011100 | 28 | 0.3117 | 0.4260 + 0.0793i | 0.1995 + 0.6025i | 0.2674 + 0.4906i |
| 011101 | 29 | 0.3117 | −0.0793 + 0.4260i | −0.1995 − 0.6025i | 0.4906 − 0.2674i |
| 011110 | 30 | 0.3117 | −0.4260 − 0.0793i | 0.1995 + 0.6025i | −0.2674 − 0.4906i |
| 011111 | 31 | 0.3117 | 0.0793 − 0.4260i | −0.1995 − 0.6025i | −0.4906 + 0.2674i |
| 100000 | 32 | 0.5636 | −0.3332 − 0.2672i | 0.1174 + 0.5512i | −0.3308 − 0.2702i |
| 100001 | 33 | 0.5587 | 0.3361 + 0.2735i | −0.3361 − 0.2735i | −0.1135 − 0.5471i |
| 100010 | 34 | 0.5587 | −0.3361 − 0.2735i | −0.1135 − 0.5471i | 0.3361 + 0.2735i |
| 100011 | 35 | 0.5587 | 0.2735 − 0.3361i | 0.1135 + 0.5471i | 0.2735 − 0.3361i |
| 100100 | 36 | 0.3082 | −0.4887 + 0.4077i | −0.6092 − 0.1842i | 0.2837 − 0.1205i |
| 100101 | 37 | 0.5636 | 0.2673 − 0.3331i | −0.1222 − 0.5501i | −0.2673 + 0.3331i |
| 100110 | 38 | 0.5636 | 0.3691 + 0.5142i | 0.3331 + 0.2673i | 0.0862 + 0.3032i |
| 100111 | 39 | 0.5587 | −0.2990 + 0.0880i | 0.3361 + 0.2735i | −0.5216 + 0.3616i |
| 101000 | 40 | 0.5587 | 0.0880 − 0.2990i | 0.3361 − 0.2735i | −0.3616 + 0.5216i |
| 101001 | 41 | 0.5587 | 0.2990 + 0.0881i | −0.3362 + 0.2735i | 0.5216 + 0.3616i |
| 101010 | 42 | 0.5587 | −0.0880 + 0.2990i | 0.3361 − 0.2735i | 0.3616 − 0.5216i |
| 101011 | 43 | 0.5587 | −0.2990 − 0.0880i | −0.3361 + 0.2735i | −0.5216 − 0.3616i |
| 101100 | 44 | 0.5636 | 0.2741 − 0.1559i | 0.2672 + 0.3332i | 0.1081 + 0.6236i |
| 101101 | 45 | 0.5636 | 0.1559 + 0.2741i | −0.2672 − 0.3332i | 0.6236 − 0.1081i |
| 101110 | 46 | 0.5587 | −0.2737 + 0.1492i | 0.2735 + 0.3361i | −0.1132 − 0.6245i |
| 101111 | 47 | 0.5587 | −0.1492 − 0.2737i | −0.2735 − 0.3361i | −0.6245 + 0.1132i |
| 110000 | 48 | 0.5000 | −0.4619 + 0.1913i | 0.3536 − 0.3536i | −0.1913 + 0.4619i |
| 110001 | 49 | 0.3117 | 0.4030 + 0.4903i | −0.6025 − 0.1995i | −0.1122 − 0.2908i |
| 110010 | 50 | 0.3117 | −0.4029 − 0.4904i | −0.1184 − 0.2883i | 0.6067 + 0.1865i |
| 110011 | 51 | 0.3082 | 0.4887 − 0.4077i | 0.1205 + 0.2837i | 0.1842 − 0.6092i |
| 110100 | 52 | 0.5000 | 0.1913 + 0.4619i | −0.3536 + 0.3536i | −0.4619 − 0.1913i |
| 110101 | 53 | 0.5000 | −0.1913 − 0.4619i | −0.3536 + 0.3536i | 0.4619 + 0.1913i |
| 110110 | 54 | 0.5000 | 0.4619 − 0.1913i | 0.3536 − 0.3536i | 0.1913 − 0.4619i |
| 110111 | 55 | 0.3117 | −0.2452 + 0.3573i | 0.6025 + 0.1995i | −0.5360 + 0.1578i |
| 111000 | 56 | 0.3117 | 0.3117 − 0.0000i | 0.4030 − 0.4903i | −0.4030 + 0.4903i |
| 111001 | 57 | 0.3117 | −0.0000 + 0.3117i | −0.4030 + 0.4903i | 0.4903 + 0.4030i |
| 111010 | 58 | 0.3082 | −0.3152 − 0.0036i | 0.4076 − 0.4888i | 0.4040 − 0.4872i |
| 111011 | 59 | 0.3082 | 0.0036 − 0.3152i | −0.4076 + 0.4888i | −0.4872 − 0.4040i |
| 111100 | 60 | 0.3117 | 0.2204 + 0.2204i | 0.4903 + 0.4030i | 0.0618 + 0.6317i |
| 111101 | 61 | 0.3117 | −0.2204 + 0.2204i | −0.4903 − 0.4030i | 0.6317 − 0.0618i |
| 111110 | 62 | 0.3082 | −0.2154 − 0.2302i | 0.4887 + 0.4077i | −0.0451 − 0.6313i |
| 111111 | 63 | 0.3082 | 0.2254 − 0.2204i | −0.4888 − 0.4076i | −0.6302 + 0.0588i |

As shown in Table 1, codewords corresponding to indices (m) 0 through 15 may be considered part of the base codebook, indices greater than 15 are combination base codebook and localized codebook.

Using a composite codebook may have an advantage in the computation of the feedback message bits. For example, selecting a codeword between 0 through 15 would mean that only the base codebook is used and that only four feedback bits need to be fedback, while a codeword between 16 and 63 is selected, then both the base codebook and the localized codebook was used and six feedback bits are to be fedback. In an alternative embodiment, even if a codeword between 16 and 63 is selected, it may be possible to feedback just the two bits corresponding to the localized codebook portion. In this embodiment, the index to the localized codebook may be used in reference to a previously fedback base codebook index.

Although the embodiments and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for base station operation in a wireless communications system, the method comprising:
   receiving, by the base station, channel information from a subscriber unit;
   extracting R codebook indices from the channel information, where R is an integer;

progressively reconstructing a channel estimate using the R codebook indices, wherein the reconstructing starts at a first codebook index and continues to an R-th codebook index, wherein the R codebook indices comprise the first codebook index and R−1 refinement indices, and wherein the reconstructing the channel estimate using an n-th index makes use of an n-th codebook; and outputting the reconstructed channel estimate.

2. The method of claim 1, wherein the reconstructing the channel estimate for the first codebook index comprises selecting a codeword from a first codebook corresponding to the first codebook index.

3. The method of claim 1, wherein the reconstructing the channel estimate for an n-th refinement index comprises:

scaling an (n−1)-th codebook with the n-th refinement index, thereby producing the n-th codebook, wherein the (n−1)-th codebook is the codebook used in the reconstructing the channel estimate for an (n−1)-th refinement index;

selecting a codeword from the n-th codebook corresponding to the n-th refinement index; and applying the selected codeword to the channel estimate reconstructed in the reconstructing the channel estimate for the (n−1)-th refinement index.

4. The method of claim 2, wherein the first codebook is a base codebook.

5. The method of claim 4, wherein the first codebook comprises a Grassmannian codebook, a Kerdock codebook, a mutually unbiased base codebook, or a vector quantization derived codebook.

6. The method of claim 1, wherein the n-th codebook comprises a localized codebook.

7. The method of claim 1, wherein the progressive reconstructing is performed in increasing order of codebook indices, from 1 to R.

8. The method of claim 1, further comprising prior to the extracting, performing an error check on the channel information.

9. The method of claim 2, wherein the n-th codebook is a subset of the first codebook.

10. A subscriber station comprising:

a channel estimate unit coupled to a receive antenna, the channel estimate unit configured to estimate characteristics of a communications channel between the subscriber station and a base station;

a mobility estimate unit coupled to the receive antenna, the mobility estimate unit configured to compute a measure of the mobility of the subscriber station;

a progressive quantization unit coupled to the channel estimate unit and to the mobility estimate unit, the progressive quantization unit configured to progressively quantize the estimated characteristics of the communications channel by quantizing the estimated characteristics with a base codebook, thereby producing a quantized estimated characteristics, and progressively quantizing the quantized estimated characteristics with localized codebooks; and a progressive feedback unit coupled to the progressive quantization unit, the progressive feedback unit configured to generate a feedback message from indices of a result of each of the quantizations into their respective codebooks.

11. The subscriber station of claim 10, wherein the progressive quantization unit is further configured to select a number of quantizations performed by the progressive quantization unit based on the measure of the mobility of the subscriber station.

12. The subscriber station of claim 10, further comprising a performance estimate unit coupled to the receive antenna, the performance estimate unit configured to estimate an indication of performance corresponding to a signal received by the receive antenna.

13. The subscriber station of claim 10, wherein the base codebook and the localized codebook are stored in a memory.

14. The subscriber station of claim 13, wherein the base codebook and the localized codebook are downloaded while the base station is in operation.

15. A method for base station operation in a wireless communications system, the method comprising:

receiving, by the base station, channel information from a subscriber unit;

extracting R codebook indices from the channel information, where R is an integer;

progressively reconstructing a channel estimate using the R codebook indices, wherein the reconstructing starts at a first codebook index and continues to an R-th codebook index, wherein the reconstructing the channel estimate using an n-th index makes use of an n-th codebook, wherein a first codebook corresponding to the first codebook index is a base codebook, and wherein the n-th codebook comprises a localized codebook; and outputting the reconstructed channel estimate.

16. The method of claim 15, wherein the reconstructing the channel estimate for the first codebook index comprises selecting a codeword from the first codebook.

17. The method of claim 15, wherein the reconstructing the channel estimate for an n-th refinement index comprises:

scaling an (n−1)-th codebook with the n-th refinement index, thereby producing the n-th codebook, wherein the (n−1)-th codebook is the codebook used in the reconstructing the channel estimate for an (n−1)-th refinement index;

selecting a codeword from the n-th codebook corresponding to the n-th refinement index; and applying the selected codeword to the channel estimate reconstructed in the reconstructing the channel estimate for the (n−1)-th refinement index.

18. The method of claim 15, wherein the first codebook comprises a Grassmannian codebook, a Kerdock codebook, a mutually unbiased base codebook, or a vector quantization derived codebook.

19. The method of claim 15, wherein the progressive reconstructing is performed in increasing order of codebook indices, from 1 to R.

20. The method of claim 15, further comprising prior to the extracting, performing an error check on the channel information.

21. The method of claim 15, wherein the n-th codebook is a subset of the first codebook.

* * * * *